United States Patent
Atsatt et al.

(10) Patent No.: US 12,248,021 B2
(45) Date of Patent: Mar. 11, 2025

(54) DEBUG TRACE MICROSECTORS

(71) Applicant: Intel Corporation, Santa Clara, CA (US)

(72) Inventors: Sean R. Atsatt, Santa Cruz, CA (US); Ilya K. Ganusov, San Jose, CA (US)

(73) Assignee: Altera Corporation, San Jose, CA (US)

( * ) Notice: Subject to any disclaimer, the term of this patent is extended or adjusted under 35 U.S.C. 154(b) by 929 days.

(21) Appl. No.: 17/132,683

(22) Filed: Dec. 23, 2020

(65) Prior Publication Data

US 2022/0196735 A1 Jun. 23, 2022

(51) Int. Cl.
*G01R 31/3177* (2006.01)
*G01R 31/317* (2006.01)
*G06F 15/78* (2006.01)
*H03K 19/17758* (2020.01)

(52) U.S. Cl.
CPC ... *G01R 31/3177* (2013.01); *G01R 31/31705* (2013.01); *G06F 15/7825* (2013.01); *H03K 19/17758* (2020.01)

(58) Field of Classification Search
CPC .......... G01R 31/3177; G01R 31/31705; G06F 15/7825; G06F 15/7867; G06F 9/30134; G06F 9/30141; G06F 11/0757; G06F 15/781; G06F 15/7871; G06F 30/34; H03K 19/17758; H03K 19/1776; H03K 19/17768
See application file for complete search history.

(56) References Cited

U.S. PATENT DOCUMENTS

| | | | | |
|---|---|---|---|---|
| 9,824,024 | B1* | 11/2017 | Ebeling | H03K 19/1776 |
| 2017/0373692 | A1* | 12/2017 | Devlin | G01R 31/3177 |
| 2019/0044519 | A1 | 2/2019 | Atsatt et al. | |
| 2019/0303311 | A1 | 10/2019 | Bilski et al. | |
| 2021/0011636 | A1* | 1/2021 | Atsatt | G06F 3/0622 |
| 2021/0287757 | A1* | 9/2021 | Troia | G11C 29/022 |

FOREIGN PATENT DOCUMENTS

GB 2500074 A 9/2013

OTHER PUBLICATIONS

European Search Report for EP Application No. 21197619.6 Mailed Jun. 20, 2022, 16 Pages.

* cited by examiner

*Primary Examiner* — Cynthia Britt
(74) *Attorney, Agent, or Firm* — Fletcher Yoder, P.C.

(57) ABSTRACT

Systems and methods described herein may relate to data transactions involving a microsector architecture. Control circuitry may organize transactions to and from the microsector architecture to, for example, enable direct addressing transactions as well as batch transactions across multiple microsectors. A data path disposed between programmable logic circuitry of a column of microsectors and a column of row controllers may form a micro-network-on-chip used by a network-on-chip to interface with the programmable logic circuitry.

13 Claims, 17 Drawing Sheets

DEBUG TRACE MICROSECTORS

BACKGROUND

The present disclosure relates to debugging using integrated circuit devices that use programmable structures arranged in microsectors.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Advances in microelectronics have enabled the continued increase in transistor densities and bandwidths for a variety of integrated circuit devices and communication techniques. Indeed, some advanced integrated circuits, such as field programmable gate arrays (FPGAs) or other programmable logic devices, may include large number of transistors that enable an increasingly wide variety of programmable circuit designs to be programmed into programmable fabric for implementation of a large number of different functions. In some cases, data generated by the functions may be packetized and routed to or from other devices to execute an operation or to communicate results of an operation. However, since a circuit design for a programmable logic device may be customized by a user for a particular application, relatively large sector-based registers used in logic fabric of these devices may over-allocate regions within the logic fabric for the circuit design.

An integrated circuit that contains programmable logic fabric provides a highly flexible platform that can be configured after manufacturing with a custom circuit design. The flexibility and variability in the possible designs that may be programmed into this type of integrated circuit, however, also provides for different regions of the integrated circuit to be used for different purposes and functions. As the integrated circuit is programmed to perform various operations, each region of the integrated circuit may have a corresponding critical path that is a function of the user's design. As such, managing the power and performance parameters of each region of different integrated circuits may involve specifically coordinated techniques.

BRIEF DESCRIPTION OF THE DRAWINGS

Advantages of the present disclosure may become apparent upon reading the following detailed description and upon reference to the drawings in which.

DETAILED DESCRIPTION OF SPECIFIC EMBODIMENTS

Figure 1:
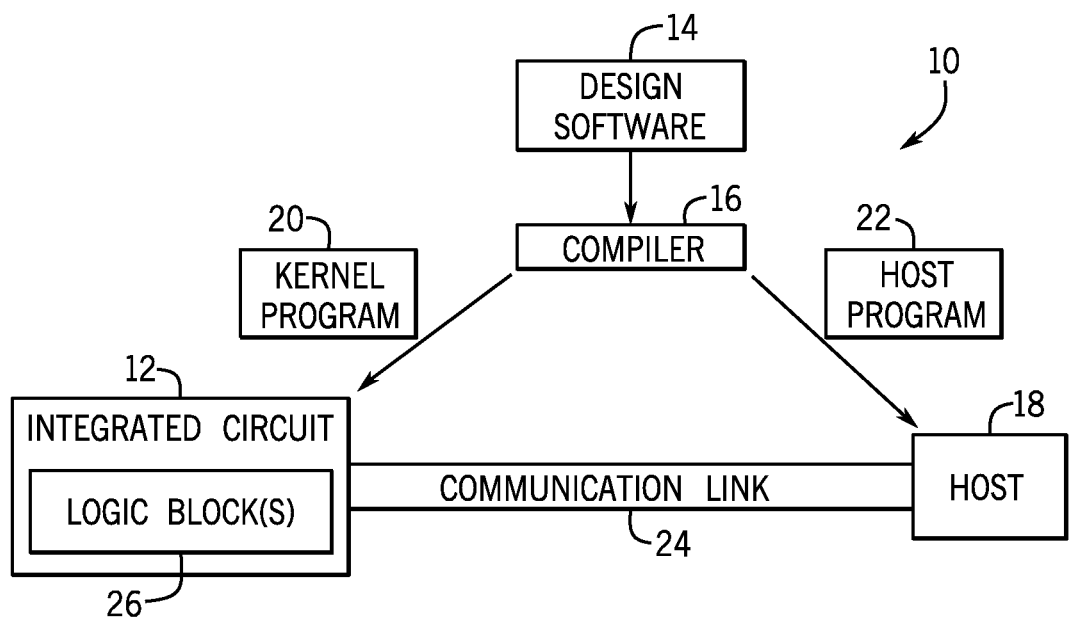
FIG. 1 is a block diagram of a system used to program an integrated circuit, in accordance with an embodiment.

One or more specific embodiments of the present disclosure will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. The techniques presented and claimed herein are referenced and applied to material objects and concrete examples of a practical nature that demonstrably improve the present technical field and, as such, are not abstract, intangible or purely theoretical.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical exclusive-OR (XOR)). In other words, the phrase A "or" B is intended to mean A, B, or both A and B.

Programmable logic devices are increasingly permeating markets and are increasingly enabling customers to implement circuit designs in logic fabric (e.g., programmable logic). Due to the highly customizable nature of programmable logic devices, the logic fabric is to be configured with a circuit design prior to use of the circuit corresponding to the circuit design. When implementing designs in the logic fabric, sectors may be used to allocate portions of the logic fabric to implement the circuit. However, a sector may be a relatively imprecise and/or large allocation of total logic fabric area due at least in part to data registers and physical arrangements of interconnections of the programmable logic device.

By rearranging some of the interconnections of the programmable logic device and/or by shrinking a data width of the data registers, systems and processes for implementing a circuit design in logic fabric may improve. For example, by making some of these changes, a size of the sector may be reduced and form a microsector, permitting a relatively finer granularity of assignment to be used to allocate the logic fabric to the circuit design. This may, for example, permit a more efficient allocation of resources to respective circuit designs, and thus enable circuit designs to use less resources in implementation.

Since a circuit design for a programmable logic device may be customized by a user for a particular application, the ability to partition and control the configuration of the device at a fine grain and/or in parallel (as may be afforded by rearrangement of the interconnections and/or shrinking of a data width of data registers) enables a number of advantages particular to devices with programmable logic. Some of the advantages may be in the construction of the device and some advantages are in the use models for the device that are enabled (e.g., enabled or permitted use cases). For construction of the device, fine-grained configurable regions may be a mechanism to enable building a device with a suitable or tailored amount of resources for implementation of that device. Some of the new use models are enabled by faster configuration, faster partial reconfiguration, and faster single-event update (SEU) detection for smaller regions of the device when compared to other systems and methods for programmable logic device programming.

These changes in system implementation may also improve (e.g., reduce) overall configuration times, including reducing configuration times used when performing partial reconfigurations, and may also enable faster single-event upset (SEU) detection. For example, the proposed structural changes described herein may enable partial reconfiguration to occur in similar amounts of time as a normal configuration.

The microsector infrastructure may use a smaller number of columns (e.g., 8 columns vs 50 columns) in a single fabric row (row region). The row region may receive data from a smaller data register (e.g., 1-bit data register as opposed to a 32-bit data register). Since a microsector may represent a relatively small percentage of area of a programmable logic device (e.g., less than 1% of total fabric area), it may be feasible to have the microsector become the partial reconfiguration quanta. This may enable the partial reconfiguration to be a write-only operation that avoids performing a read-modify-write each time partial reconfiguration is to occur for the microsector, thereby saving time and resources for the partial reconfiguration. In some cases, the partial reconfiguration time may be reduced by a factor of five or six, a relatively high amount of performance improvement. Furthermore, since the number of columns is reduced, the amount of time spent waiting for a data transmission to complete (either to the row region or from the row region) may reduce, thereby improving operation of the programmable logic device.

A microsector architecture may be combined with network-on-chip (NOC) data transmission methods. Standard NOC implementations are sometimes inefficiently applied field programmable gate arrays (FPGAs) or other programmable logic devices. For example, these implementations do not account for repetitive nature of the FPGA programmable logic, nor account for aspect ratio differences and data density implications of connecting to FPGA programmable logic with a standard NOC. Thus, merely using programmable logic with a standard NOC may limit usability, may reduce available transaction bandwidths, and may increase latencies.

This disclosure describes an interface that enables communication between programmable logic having a microsector architecture and a NOC, while avoiding adverse effects from interfacing the two. In particular, this disclosure describes data transactions associated with a microsector architecture that may use one or more micro-network-on-chips (microNOCs) disposed within unused wire tracks of the microsector architecture to form a columnar-oriented networked structure that uses extensible data handling processes. The columnar-oriented networked structure is a repetitive structure used to interface between programmable logic and one or more NOCs, which fits within programmable logic memory columns (e.g., FPGA fabric memory columns). The extensible columnar-oriented networked structure may permit high bandwidth and relatively complex data transactions similar to transactions performed using a network-on-chip (NOC) but without burdening the device with a large footprint or a performance penalty. These benefits may be provided natively with the architecture and independent of any further performance optimizations made by a complier or during a programmable logic design process.

Indeed, described herein are structures that provide one or more microNOCs as well as methods that may be used to address specific microNOCs or specific devices of a microNOC (i.e., specific microsectors). These systems and methods may provide a control mechanism to request loading and unloading of specific memories associated with specific microNOCs (e.g., specific memories of specific row controllers) to or from on-chip memories or off-chip memories. Furthermore, these system and methods may dramatically reduce the complexity of routing of high-bandwidth data buses between memory and into programmable logic (e.g., deeply located configuration memory) while increasing ease of use for customers and control systems implementing the transactions. Reducing system complexity may cause reduced power consumption and more efficient resource consumption within an integrated circuit performing these memory transactions. Indeed, these systems and methods may reduce power consumption amounts associated with moving data from off-chip memory interfaces to programmable logic by using dedicated bussed routing to portions of the microNOCs, as opposed to soft logic routing. It is noted that soft logic routing uses relatively large quantities of flip-flops and/or latches to exchange data, which may increase latencies with data transmissions and may depend on a distributed clocking signal network propagating clocks with aligned timings. By reducing an amount soft logic-based routing used to transmit data, data transmissions may happen faster with less of a reliance on precise clocking alignments and with the additional benefit of freeing up soft logic for other uses.

A microNOC may include a column of row controllers each connected to a shared data path (e.g., a shared vertical data path) and a respective microsector. The data path and the row controllers of the microNOC may include hardened logic. The row controller may include hardened logic, which interfaces with the hardened logic and the soft logic of the microsector. The row controller may communicate with controllers disposed outside of a programmable logic by way of messages transmitted via the shared data path. These messages may include transaction-related data, headers, command indications, slots for data to be stored in, or the like, to communicate between the row controllers and other devices, such as devices external to the microsector, other row controllers, or even portions of programmable logic programmed to perform a logic function.

Data may be transmitted to one or more microsectors using data streaming protocols and using bi-directional movements. In this way, one or more row controllers may inspect a header of a packet before accessing a payload of the packet to determine which of the row controller the packet is to be delivered. When a row controller finds a packet has a header matching its own identifier, the row controller may receive the packet and process any data and/or command included in the packet. This structure may help improve transaction speeds since multiple concurrent traffic flows in one or two data movement directions may occur even within a same column of microsectors. For example, the microNOC includes a shared data path that uses data streaming processes to deliver different commands to different row controllers at a same time by segregating command delivery in different packets with different headers.

A microNOC, a column manager, and/or a row controller may each be individually addressed using a logical address described herein. This may enable direct access to a location in programmable memory by direct addressing to its corresponding row controller. A logical address space is discussed herein. Using the logical address space to address a packet to a specific row controller in combination with routing circuitry between column managers and paths to microNOCs may enable any peripheral device in communication with a NOC and/or any column manager to communicate with the specific row controller.

Indeed, as discussed herein, data transactions may occur between a row controller and any suitable data source and/or end point using direct addressing. This may let, for example, a logic design implemented in a portion of programmable logic generate an instruction to cause a reading or writing of data to another portion of programmable logic. Each column manager may help perform several types of transactions, and each type of transaction may use the direct addressing process. These transactions may include a directly addressed read, a directly addressed write, a first-in, first-out (FIFO) read (e.g., streaming read), a FIFO write (e.g., streaming write), a load (e.g., plural write, batch write), and an unload (e.g., plural read, batch read).

Transactions involving directly addressed reads or writes may use addresses from a global address space that reference specific row controllers (or groups of row controllers) to access data stored in microsectors. These transactions may read or write any suitable number of words from any location in any enabled row controller (e.g., a row controller having an address assigned). Transactions involving FIFO reads or writes may continuously stream data to or from one or more row controllers and to or from another device (e.g., an on-chip memory, an off-chip memory, one or more processors). Moreover, transactions involving loads or unloads may perform a block movement between one or more row controllers and another device (e.g., an on-chip memory, an off-chip memory, one or more processors).

Direct addressing methods and data streaming methods may permit a relatively large amount data to transmit between programmable logic and a data source (or data end point). For example, a column manager directly addressing one or more row controllers and/or one or more microNOCs for a transaction may improve processing speeds associated with moving data for machine learning uses, signal processing uses, graphic processing unit (GPU) calculations, and/or other data intensive uses by simplifying these otherwise complex transactions.

Another benefit from using addressing methods and the microNOCs described herein includes the ability to store data in a different order than a logical read and/or write order. Data may be read from a register of a column manager in a logical order. But, the data may be read from the programmable logic in a different order than the logical order. The feature of being able to read and write data into the different row controllers in an order differing from this logical order represents a dramatic improvement in memory access, and more particularly, programmable logic access methods. This is an improvement beyond typical processes than involve reading and writing data into programmable logic according to the logical order. Being able to store data in any order may permit column managers to store the data in a convenient order for the operation rather than being restricted to the logical order. Thus, the column managers may have the capability to pack data in a single microNOC column or according to data striping processes across multiple microNOC columns, in whichever order is deemed more convenient (e.g., of lower cost, of lower memory usage overall, of lesser footprint) by the column manger and/or system overall.

With the foregoing in mind, FIG. 1 illustrates a block diagram of a system 10 that may implement arithmetic operations. A designer may desire to implement functionality, such as the arithmetic operations of this disclosure, on an integrated circuit 12 (e.g., a programmable logic device such as a field-programmable gate array (FPGA) or an application-specific integrated circuit (ASIC)). In some cases, the designer may specify a high-level program to be implemented, such as an OPENCL® program, which may enable the designer to more efficiently and easily provide programming instructions to configure a set of programmable logic cells for the integrated circuit 12 without specific knowledge of low-level hardware description languages (e.g., Verilog or VHDL). For example, since OPENCL® is quite similar to other high-level programming languages, such as C++, designers of programmable logic familiar with such programming languages may have a reduced learning curve than designers that are required to learn unfamiliar low-level hardware description languages to implement new functionalities in the integrated circuit 12.

The designer may implement high-level designs using design software 14, such as a version of INTEL® QUARTUS® by INTEL CORPORATION. The design software 14 may use a compiler 16 to convert the high-level program into a lower-level description. The compiler 16 may provide machine-readable instructions representative of the high-level program to a host 18 and the integrated circuit 12. The host 18 may receive a host program 22 which may be implemented by the kernel programs 20. To implement the host program 22, the host 18 may communicate instructions from the host program 22 to the integrated circuit 12 via a communications link 24, which may be, for example, direct memory access (DMA) communications or peripheral component interconnect express (PCIe) communications. In some embodiments, the kernel programs 20 and the host 18 may enable configuration of a logic block 26 on the integrated circuit 12. The logic block 26 may include circuitry and/or other logic elements and may be configured to implement arithmetic operations, such as addition and multiplication.

The designer may use the design software 14 to generate and/or to specify a low-level program, such as the low-level hardware description languages described above. Further, in some embodiments, the system 10 may be implemented without a separate host program 22. Moreover, in some embodiments, the techniques described herein may be implemented in circuitry as a non-programmable circuit design. Thus, embodiments described herein are intended to be illustrative and not limiting.

Figure 2:
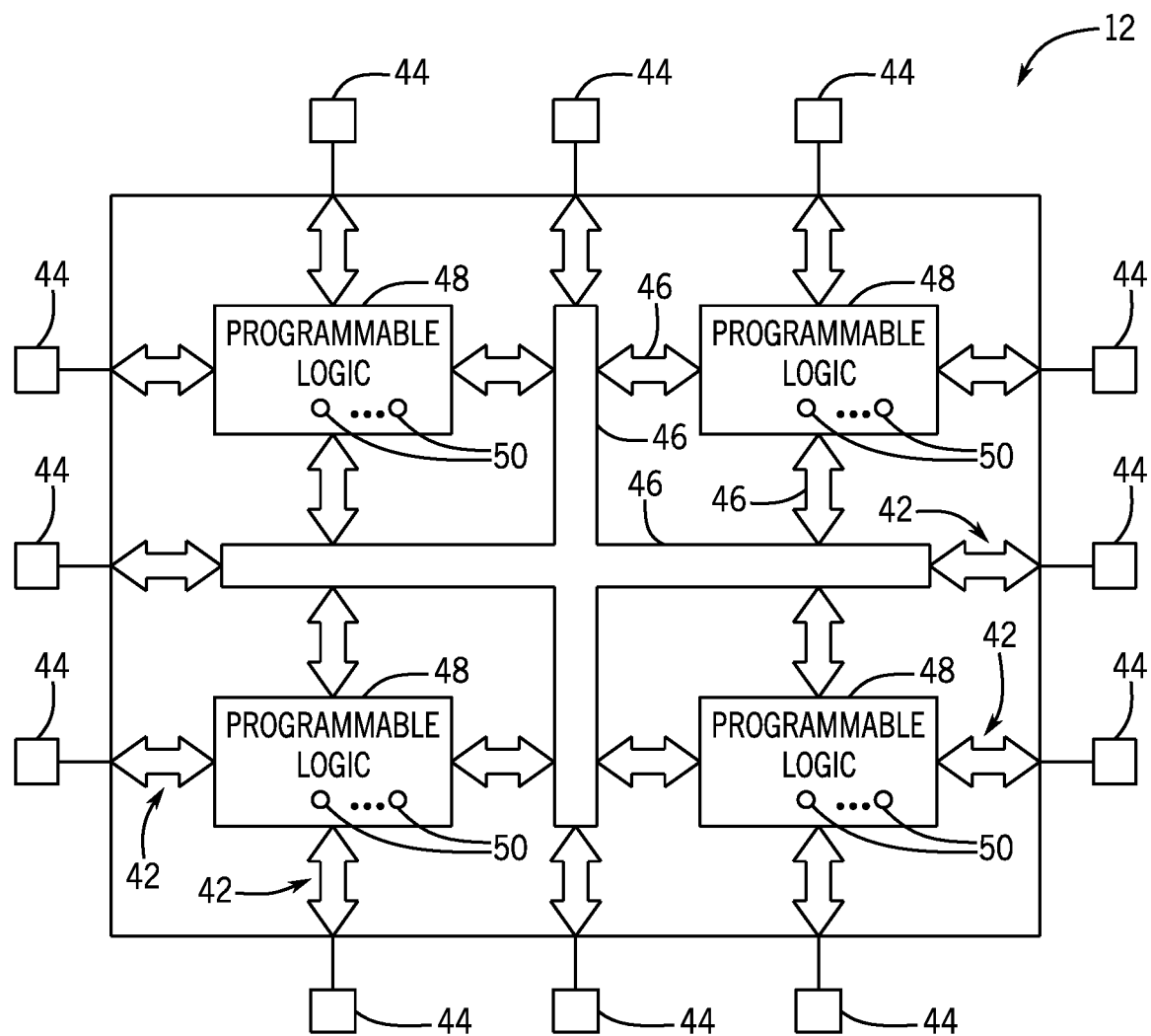
FIG. 2 is a block diagram of the integrated circuit of FIG. 1, in accordance with an embodiment.

Turning now to a more detailed discussion of the integrated circuit 12, FIG. 2 is a block diagram of an example of the integrated circuit 12 as a programmable logic device, such as a field-programmable gate array (FPGA). Further, it should be understood that the integrated circuit 12 may be any other suitable type of programmable logic device (e.g., an ASIC and/or application-specific standard product). The integrated circuit 12 may have input/output circuitry 42 for driving signals off device and for receiving signals from other devices via input/output pins 44. Interconnection resources 46, such as global and local vertical and horizontal conductive lines and buses, and/or configuration resources (e.g., hardwired couplings, logical couplings not implemented by user logic), may be used to route signals on integrated circuit 12. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48.

Programmable logic devices, such as the integrated circuit 12, may include programmable elements 50 with the programmable logic 48. For example, as discussed above, a designer (e.g., a customer) may (re)program (e.g., (re)configure) the programmable logic 48 to perform one or more desired functions. By way of example, some programmable logic devices may be programmed or reprogrammed by configuring programmable elements 50 using mask programming arrangements, which is performed during semiconductor manufacturing. Other programmable logic devices are configured after semiconductor fabrication operations have been completed, such as by using electrical programming or laser programming to program programmable elements 50. In general, programmable elements 50 may be based on any suitable programmable technology, such as fuses, antifuses, electrically-programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using input/output pins 44 and input/output circuitry 42. In one embodiment, the memory cells may be implemented as random-access-memory (RAM) cells. The use of memory cells based on RAM technology is described herein is intended to be only one example. Further, since these RAM cells are loaded with configuration data during programming, they are sometimes referred to as configuration RAM cells (CRAM). These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Keeping the discussion of FIG. 1 and FIG. 2 in mind, a user (e.g., designer) may utilize the design software 14 to implement the logic block 26 on the programmable logic 48 of the integrated circuit 12. In particular, the designer may specify in a high-level program that mathematical operations such as addition and multiplication be performed. The compiler 16 may convert the high-level program into a lower-level description that is used to program the programmable logic 48 to perform addition.

Figure 3:
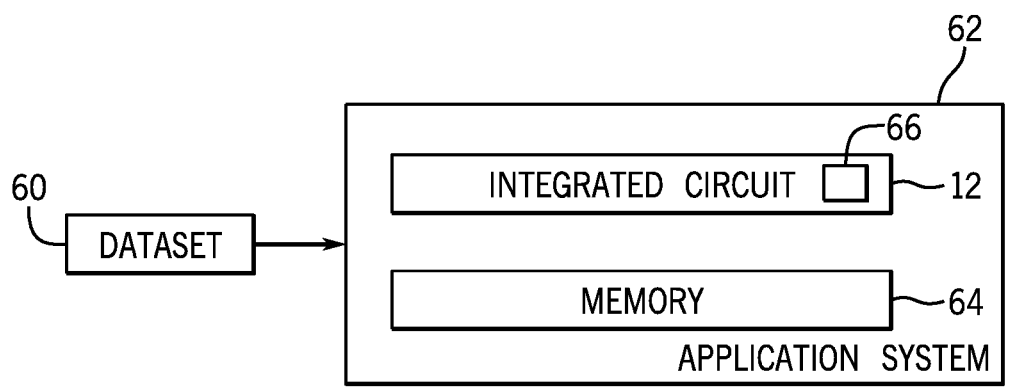
FIG. 3 is a block diagram of an application system that includes the integrated circuit of FIG. 1 and a memory, in accordance with an embodiment.

Once programmed, the integrated circuit 12 may process a dataset 60, as is shown in FIG. 3. FIG. 3 is a block diagram of an application system 62 that includes the integrated circuit 12 and memory 64. The application system 62 may represent a device that uses the integrated circuit 12 to perform operations based on computational results from the integrated circuit 12, or the like. The integrated circuit 12 may directly receive the dataset 60. The dataset 60 may be stored into the memory 64 before, during, or concurrent to transmission to the integrated circuit 12.

As bandwidths and processing expectations increase, such as in response to the advent of fifth generation (5G) and higher communication techniques and/or widespread use of neural networks (e.g., machine learning (ML) and/or artificial intelligence (AI) computations) to perform computations, the integrated circuit 12 may be expected to handle subsequent increases in size of the dataset 60 over time. The integrated circuit 12 may also be expected to perform digital signal processing operations of signals transmitted using 5G or higher techniques (e.g., signals of higher throughput and/or high data transmission bandwidths) and ML operations. These desired applications may also be implemented dynamically, during runtime, such as during a partial reconfiguration that causes configuration of a portion of the integrated circuit 12 without causing configuration of another portion of the integrated circuit 12 during runtime operations of the integrated circuit. For at least these reasons, it may be desired to improve configuration methods to meet complexity and timing specifications of technical computations. To do so, programmable logic 66 that includes at least the programmable logic 48, the input/output pins 44, and interconnection resources 46, may leverage a 1-bit data register to (re)configure the programmable logic 48 using microsectors. Using microsectors to program circuitry functions in the programmable logic 48 may provide the advantages of enabling write-only reconfiguration, relatively smaller region SEU detection (e.g., 1-bit region of detection), relatively smaller granularities for reconfiguration regions, and relatively larger parallel configuration (e.g., parallel configuration of data channels of 1-bit width) operations. As used herein, the term microsector refers to a sector of programmable logic that has a data register that is comparatively small. In one example, a microsector has a 1-bit data register. In some embodiments, a microsector may have a larger data register, but still may be smaller than what is ordinarily found in a sector (e.g., may be less than 32 bits, less than 16 bits, less than 8 bits).

Figure 4B:
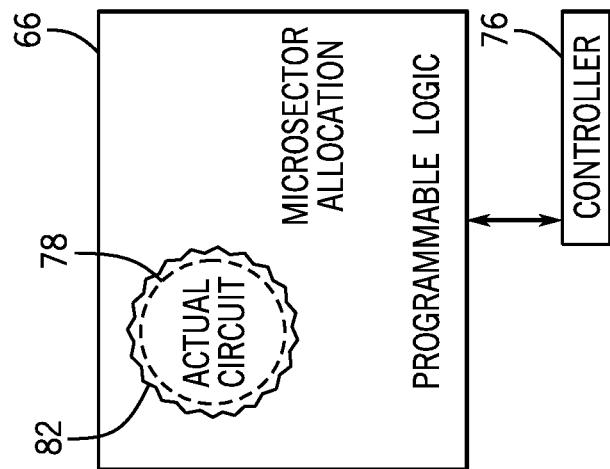
FIG. 4B is a block diagram of programmable logic of the integrated circuit of FIG. 1 implemented using microsector allocations, in accordance with an embodiment.
Figure 4A:
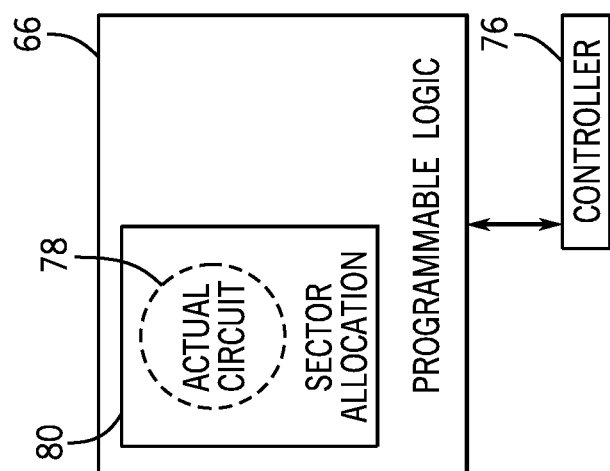
FIG. 4A is a block diagram of programmable logic of the integrated circuit of FIG. 1 implemented using sector allocations, in accordance with an embodiment.

To elaborate regarding the smaller granularities for reconfiguration regions, FIG. 4A is a block diagram of example programmable logic 66. The programmable logic 66 may include a controller 76 to program the programmable logic 66. When programmed, the circuitry of the programmable logic 66 may be used to perform digital signal processing, machine learning processing, computations, logic functions, or the like (e.g., represented by portion 78). However, the programmable logic 66 may be divided in relatively large logical sectors, and thus a portion 80 may be allocated to the circuitry as opposed to a region of circuitry corresponding to the portion 78. This overallocation of resources may waste circuitry since size differences between the portion 80 and the portion 78 represent underutilized programmable logic 66. It is noted that when partially reconfiguring programmable logic 66, certain speed metrics may be desired to be met (e.g., partial reconfiguration may be desired to be completed in a relatively fast amount of time). In these cases, for example, overallocation of resources may occur since slower configuration speeds may be undesired that may improve allocation of resources.

Indeed, if a device is built in the programmable logic of a multiple of sectors, the device may likely have more or less logic (e.g., logic arithmetic blocks (LABs), digital signal processing (DSP) blocks) than is desired to be allocated to building the device. This overallocation may occur since a rectangular number of sectors is used to implement the example device. By rearranging the interconnections and/or shrinking a data width of data registers to form microsectors, a relatively more exact amount of logic (e.g., more accurate number of LABs or DSP blocks) may be allocated to implementation of the device.

When implementing circuitry represented by the portion 78 in programmable logic 66 that uses microsector logical divisions, as shown in FIG. 4B, less programmable logic 66 may be wasted when implementing the circuitry. FIG. 4B is a block diagram of the programmable logic 66 implemented using microsectors. Indeed, microsectors may permit the circuitry corresponding to the portion 78 to be implemented in a region represented by portion 82. Although not drawn to scale, the portion 82 implementing circuitry corresponding to the portion 78 efficiently utilizing the programmable logic 66 where the portion 80 implementing the portion 78 may otherwise inefficiently utilize the programmable logic 66.

Figure 5:
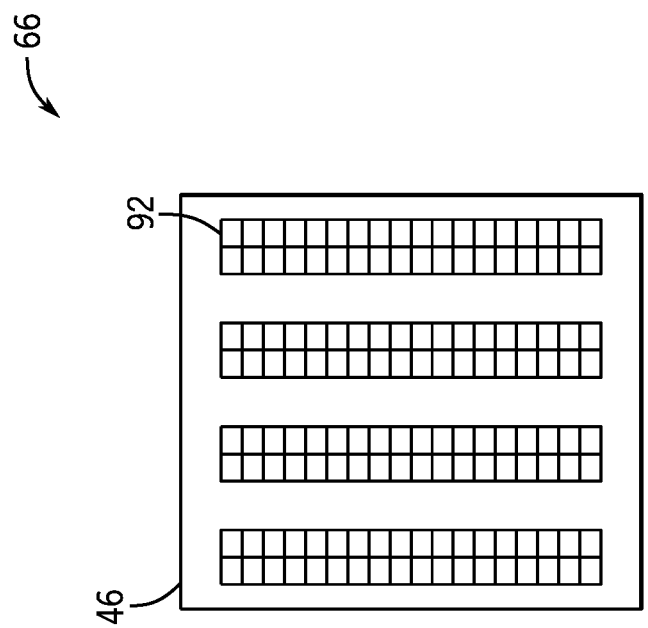
FIG. 5 is a block diagram of the programmable logic of FIG. 4B, in accordance with an embodiment.

To elaborate further on a microsector architecture, FIG. 5 is a block diagram of the programmable logic 66. The programmable logic 66 may couple between microsectors 92 using the interconnection resources 46. Indeed, the interconnection resources 46 may include any suitable combination of data shifting registers, registers, logical gates, direct couplings, reprogrammable circuitry, or the like able to be used to move data from a first location to a second location within the programmable logic 66 and/or within the integrated circuit 12. One or more microsectors 92 may be programmed by the controller 76 with information to perform functions of circuitry, such as the circuitry corresponding to portion 78. However, since the controller 76 may transmit configuration data (or any suitable data), the granularity of regions used to program functions into the programmable logic 66 may reduce. When these granularities reduce or become more precise (e.g., smaller), programming of the programmable logic 66 may improve since circuit designs may be more efficiently configured in the programmable logic 66. It is noted that the programmable logic 66 and/or the integrated circuit 12 may be any suitable type of software or hardware, or a combination of the two. The integrated circuit 12 and/or the programmable logic 66 may be or include programmable logic 48, programmable elements 50, or the like, to enable one or more portions to be reprogrammable (e.g., reconfigurable). The controller 76 may interface with the microsectors 92 using the interconnection resources 46 that may include interface buses, such as an advanced interface bus (AIB) and/or an embedded multi-die interconnect bridge (EMIB). As described above, the programmable logic 66 may be a reprogrammable circuit capable of performing a multitude of tasks.

Figure 6:
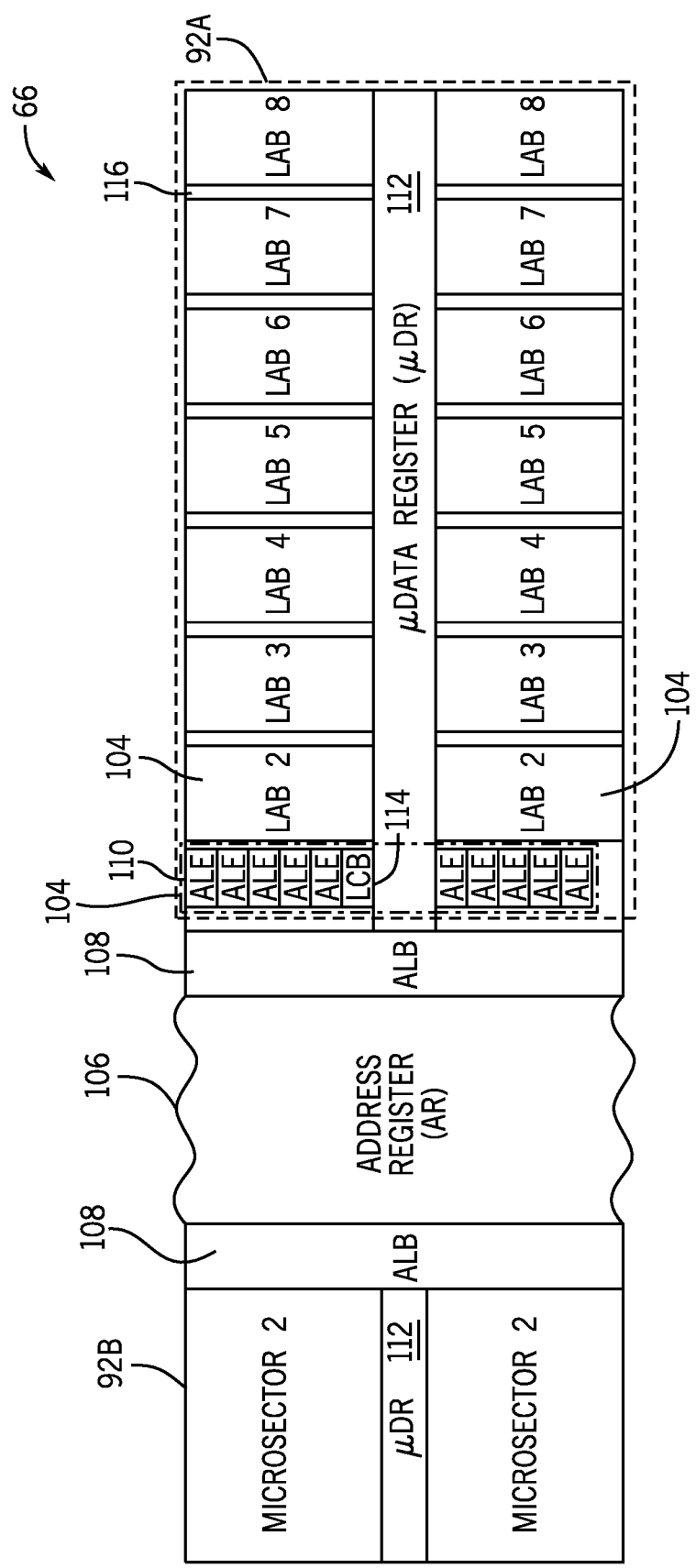
FIG. 6 is a block diagram of a microsector of the programmable logic of FIG. 5, in accordance with an embodiment.

FIG. 6 is a block diagram of two example microsectors 92 (e.g., microsector 92A, microsector 92B). This application describes a particular architecture of microsectors 92; however, it should be understood that any suitable architecture may be used. Indeed, each microsector 92 may include one or more logic access blocks (LAB) 104 (e.g., eight LABs) able to interface with the interconnection resources 46 (shown here to communicate with the microsectors 92 via an address register 106 (AR)). Indeed, the interconnection resources 46 may include one or more ARs 106 to transmit and/or receive signals from the microsectors 92, as well as or in alternative of other control circuitry, logic circuitry (e.g., AND gates, OR gates, not-OR gates, exclusive-OR gates, flip-flops, switch-reset latches), or the like. It should also be understood that same or similar circuitry may be included in each microsector 92.

The LABs 104 may receive data from the AR 106 through an address line buffer (ALB) 108. The ALBs 108 may each include digital signal processing (DSP) circuitry and/or control circuitry that converts data from a suitable format for transmission to the microsector 92A to a suitable format for use by circuitry of the LAB 104.

Each LAB 104 may include some number of arithmetic logic element circuitry (ALE) 110 circuits (e.g., ten ALEs 110). A micro-data register (μDR) 112 may be disposed on at least some of the ALEs 110, such as in another layer of silicon, or other material, used to physically form the integrated circuit. The μDR 112 communicatively couples each LAB 104 to the ALB 108. Each ALE 110 of the LAB 104 may share and/or couple to the LAB-wide Control Block (LCB) 114. The LABs 104 are separated from each other by routing fabric 116 (e.g., configuration random access memory (CRAM), configuration memory). In this example, the μDR 112 runs through the LCB 114 via a center of a row of circuitry corresponding to the microsector 92A.

Figure 7:
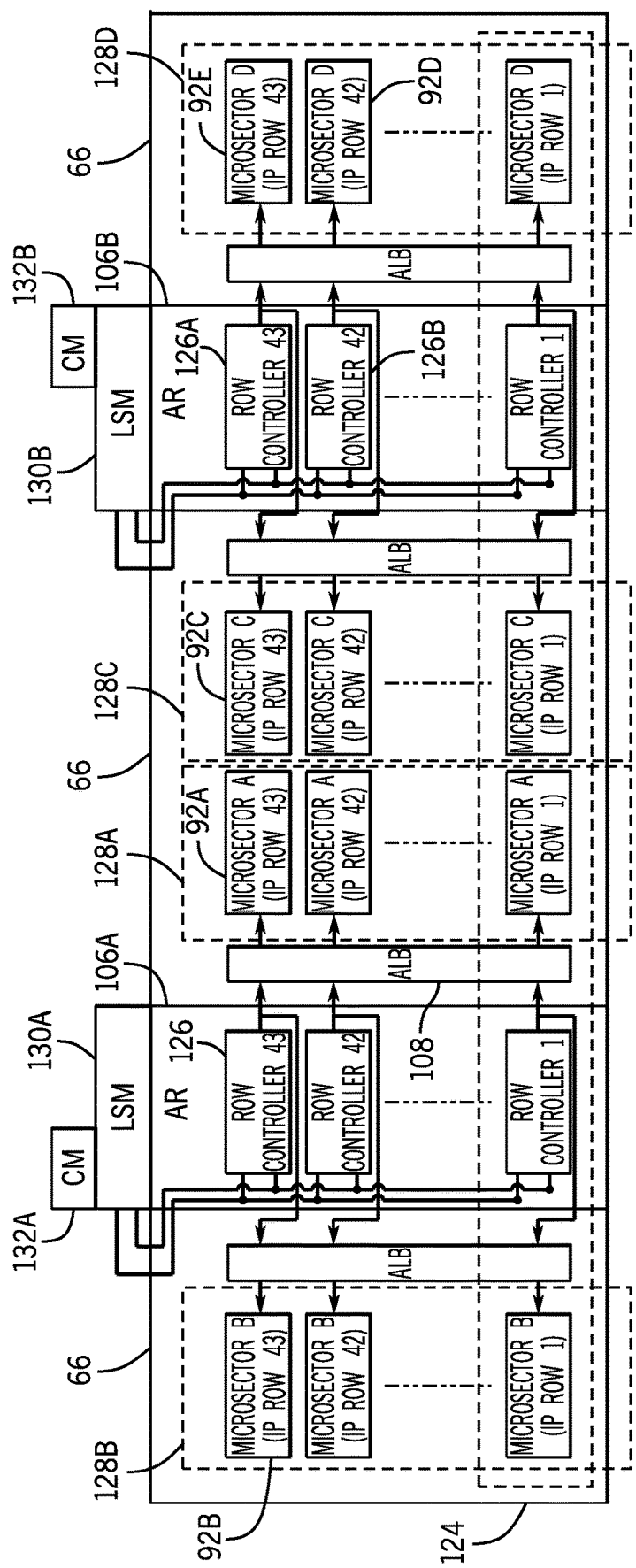
FIG. 7 is a block diagram of a portion of the programmable logic and at least some control circuitry for the portion of the programmable logic, in accordance with an embodiment.

To elaborate further on interconnections between the AR 106 and the microsectors 92, FIG. 7 is a block diagram of rows regions (row regions) 124 and row controllers 126 implemented in the AR 106 illustrating communicative couplings between the row controllers 126 and the microsectors 92 from FIG. 6. It is noted that microsectors 92 may sometimes be referred to in terms of row regions 124 since designs like manufacturer designs (e.g., manufacturer IP) or user designs (e.g., user IP) may be loaded into the microsectors 92 for implementation. The AR 106 may include any suitable control system circuitry and/or logic circuitry. Indeed, the AR 106 may be an address register from INTEL® STRATIX 10® or INTEL® AGILEX® by INTEL CORPORATION. Furthermore, the AR 106 shown is disposed between at least two microsectors 92. There are some instances where the AR 106 may be disposed by just one column region 128 of microsectors 92 (e.g., orientated on the right side of the AR 106 or on the left side of the AR 106) to accommodate physical boundaries of the programmable logic 66 or the integrated circuit 12 or to avoid supporting left and right data movement patterns. The various row regions 124 and column regions 128 are arranged as a grid on a same physical board.

Each row controller 126 may control a row region 124 of microsectors, and thus be associated with or be the ALB 108 described earlier. For the microsector implementation, the AR 106 may be repeated and shared between column region 128 (e.g., column region 128A, column region 128B, column region 128C, column region 128D) of microsectors 92. For example, column region 128A shares an AR 106A with the column region 128B, and is disposed adjacent to a column region 128C. The microsectors 92 of the column region 128C may share the AR 106B with microsectors 92 of the column region 128D. Thus, the microsectors 92 of column region 128C may be controlled using signals generated and/or transmitted by the row controllers 126 of the AR 106B independent of at least some signals transmitted via the AR 106A. Although part of a same row region 124, the microsector 92C may be controlled differently from the microsector 92B since the microsectors 92 being associated with different column region 128. Furthermore, although part of a same column region (e.g., column region 128C), the microsector 92C may be controlled differently from the microsector 92D since the microsectors 92 receive control signals from separate row controllers 126 (e.g., row controller 126A, row controller 126B). Microsectors 92 may be formed to divide the row region 124 into smaller portions, and thus provide the smaller granularity.

The row controllers 126 may use any suitable communication protocol to transmit and/or receive signals from respective microsectors 92. For example, the row controllers 126 may use a streaming protocol, such as Advanced eXtensible Interface (AXI) 4 Streaming, to receive an address and data corresponding to the address in a same symbol (e.g., same packet transmission) at internal write registers (e.g., internal to a respective row controller 126).

Each AR 106 may include a local sector manager (LSM) 130 (e.g., LSM 130A, LSM 130B) at the bottom or top of the AR 106 column region to interface with its corresponding CM 132. For example, the LSM 130A is shown at the top of and communicatively coupled to the AR 106A column region and the CM 132A. The LSM 130A is also disposed outside of the programmable logic 66. One LSM 130 may be included per AR 106, however it should be understood that LSMs 130 may be shared by two or more AR 106, such that one LSM 130 controls two or more AR 106.

Sometimes, the LSMs 130 may be integrated with an AR column manager (CM) 132 (e.g., CM 132A, CM 132B) to form respective sector column managers (SCM). Although depicted as separate blocks, CMs 132 may be included in a same column manager. An example layout of a CM 132 with associated AR 106 is described below with reference to FIG. 8.

Each CM 132 may be responsible for managing transactions between device of its corresponding AR 106 and the interconnection resources 46. For example, the CM 132A may coordinate with the LSM 130A to transmit a command to the microsector 92A and the microsector 92B. The CM 132 and LSMs 130 may be involved with routing commands, such as configuration instructions, to certain microsectors 92 from other portions of the integrated circuit 12 or from other microsectors 92. In cases where the interconnection resources 46 involve use of a network-on-chip, the CMs 132 may manage transactions between the network-on-chip and the corresponding AR 106. This arrangement may permit relatively high bandwidth data movement between master and slave bridges implemented via the interconnection resources 46 since, for example, the CMs 132 may help coordinate transmission between multiple microsectors and/or multiple ARs 106, such that the transmissions may be paralleled, or at least partially coordinated in time and/or in sequence.

A controller, such as the controller 76, may transmit packets to each of the LSMs 130 and/or CMs 132 that include data and commands to perform a configuration and a test of the configuration. To implement the configuration, one or more LSMs 130 may generate respective commands interpretable by respective row controllers 126, where the respective commands may be used to control configuration of one or more microsectors 92. The data and commands transmitted to a LSM 130 from the controller 76 may correspond to a portion of a circuit design represented by the configuration to be implemented in the subset of microsectors 92 managed (e.g., communicatively coupled) to the respective LSM 130. Once the configuration is implemented in the programmable logic 66 (or at least partially implemented), the one or more LSMs 130 may test the implemented configuration to verify that the configuration operates as expected. The test may be performed using a portion of the data and commands received by the LSM 130 from the controller 76. The LSMs 130 may test the respective portion of the circuit design corresponding to its respective intersections of column regions 128 and row regions 124 at least partially overlapping in time to the programming (e.g., configuration) of additional portions of the programmable logic 66, such as while one or more other row regions 124, column regions 128, or microsectors 92, continue to be programmed (e.g., configured). Once each portion of the programmable logic 66 is programmed, the LSMs 130 may coordinate in operation and perform a system-wide test of one or more circuit designs implemented in one or more microsectors 92. Testing performed may include aggregation operations that verify operations of portions of circuitry, in addition to verifying whole circuit operation. Each LSM 130 may operate as a management engine for its local set of the microsectors 92.

Indeed, each row controller 126 may receive a command from its corresponding LSM 130 and may decode the command to generate control signals. The control signals may control operation of the corresponding row region 124 of microsectors 92. For example, the row controller 126A, coupled between the microsector 92C and the microsector 92E, may generate control signals used for controlling operation of the microsector 92C and the microsector 92E disposed in a same row region 124. Furthermore, as opposed to the LSM 130 controlling multiple column regions 128, each LSM 130 may control two column regions 128.

For example, the LSM 130 may generate commands associated with read and write operations. In some cases, the LSM 130 may also command the row controller 126 to decompress (e.g., decode) data associated with the command before transmitting data to a respective microsector 92. The row controller 126 may be considered a configuration endpoint that may be read from and/or written to by the LSM 130 and/or the controller 76 via the interconnection resources 46 to read or write data (e.g., configuration data, test data) to the microsector 92. It is noted that although shown as including 43 row regions 124, and 43 row controllers 126, any suitable number of row regions 124, column regions 128, and the like may be used in the integrated circuit 12 to implement systems and methods described herein.

Figure 8:
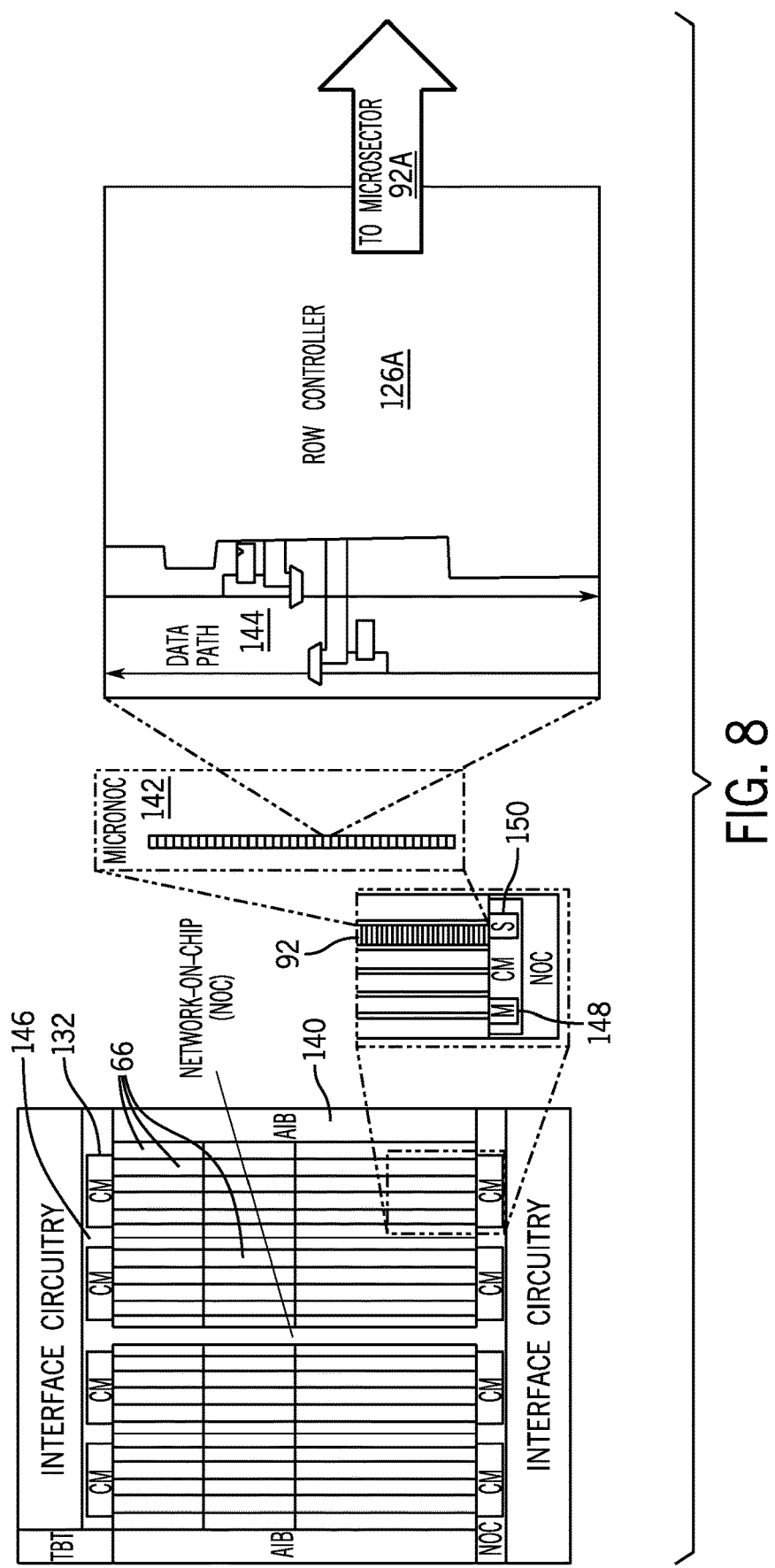
FIG. 8 is a block diagram of a micro-network-on-chip data path coupled to a row controller of FIG. 7, in accordance with an embodiment.

Continuing now to discuss an example chip layout and an example of the AR 106 (i.e., a micro-network-on-chip), FIG. 8 is a block diagram of a micro-network-on-chip (microNOCs) 142 that includes a bi-directional data path 144 and multiple row controllers 126. This extensible columnar-oriented network structure fits within fabric memory columns of the programmable logic 66, and permits data transaction operations like dynamic and/or static bandwidth allocations, virtual channels, and the like. Each microNOC 142 is formed from the bi-directional data path 144 interconnecting a column of row controllers 126 to a respective CM 132 and, if used, a respective LSM 130. A subset of microNOCs 142 may share the respective CM 132.

Each CM 132 may couple to a network-on-chip (NOC) 146. In some cases, the interconnection resources 46 may include and/or form the network-on-chip (NOC) 146. When used in an FPGA, the fabric of the FGPA die may integrate the NOC 146. The NOC 146 may communicate with the individual row controllers 126, and thus the programmable logic 66, using commands sent through the microNOCs 142. In some cases, the NOC 146 may include horizontal NOC circuitry and vertical NOC circuitry, such that the NOC 146 as a whole is not contiguous. Even in these cases, however, the NOC 146 intersects horizontally with each microNOC 142, and thus intersects horizontally with each microsector 92 corresponding to the programmable logic 66. The programmable logic 66 may be accessed by using row controllers 126 to interface with corresponding microsectors 92. Furthermore, each row controller 126 may include memory (e.g., random-access memory (RAM), cache memory) that may be accessed before, after, or in conjunction with access to associated programmable logic 66. The row controllers 126 of FIG. 8 may include the row controller 126A. It is noted that one or more of the microNOCs 142 may include additional circuitry not depicted or described herein.

A CM 132 may span multiple microNOC 142 columns (e.g., one, two, three, ten, any suitable number). In this example, one CM 132 may control five microNOC 142 columns. Each CM 132 may communicate with the row controllers 126 associated with the subset of microNOC 142 coupled to the CM 132. When transmitting a command, the CM 132 may receive the command, determine which portion of programmable logic 66 to communicate with based on the command, and determine which microNOC 142 to transmit the command based on the portion of programmable logic 66. Since the data path 144 is bi-directional, the CM 132 may transmit and receive messages simultaneously on a same microNOC 142.

To receive and/or transmit commands, the CM 132 may include a master interface 148 and a slave interface 150. In some cases, commands and/or data may be communicated from external software or a peripheral component using an advanced interface bus (AIB) 140 to a respective row controller 126 of a respective microNOC 142.

A trace buffer trigger 250 may provide buffer memory for collecting register state traces collected from microsectors using highly pipelined (HIPI) debug trace capabilities described below. For example, if a user wants to capture a lot of trace data over a short period of time, external memory and transceiver may not have enough bandwidth to send all the data to off-chip locations at once. When on-chip buffer memory has much higher bandwidth than off-chip interfaces, it can accept a short burst of high-bandwidth data which can be later sent through a narrow off-chip communication link to the off-chip destination.

The trace trigger buffer 250 may also detect specific conditions in register traces to aid user-level debug operations. For example, a user may want to know on what clock cycle a specific multi-bit variable reached a value of zero. The trace trigger buffer 250 may process traces from multiple microNOCs to collect all bits belonging to this variable, may align all those bits to specific cycles, and may generate a signal when all bits are equal to zero on a specific cycle.

Debug and Real Time Trace of Registers

Figure 9:
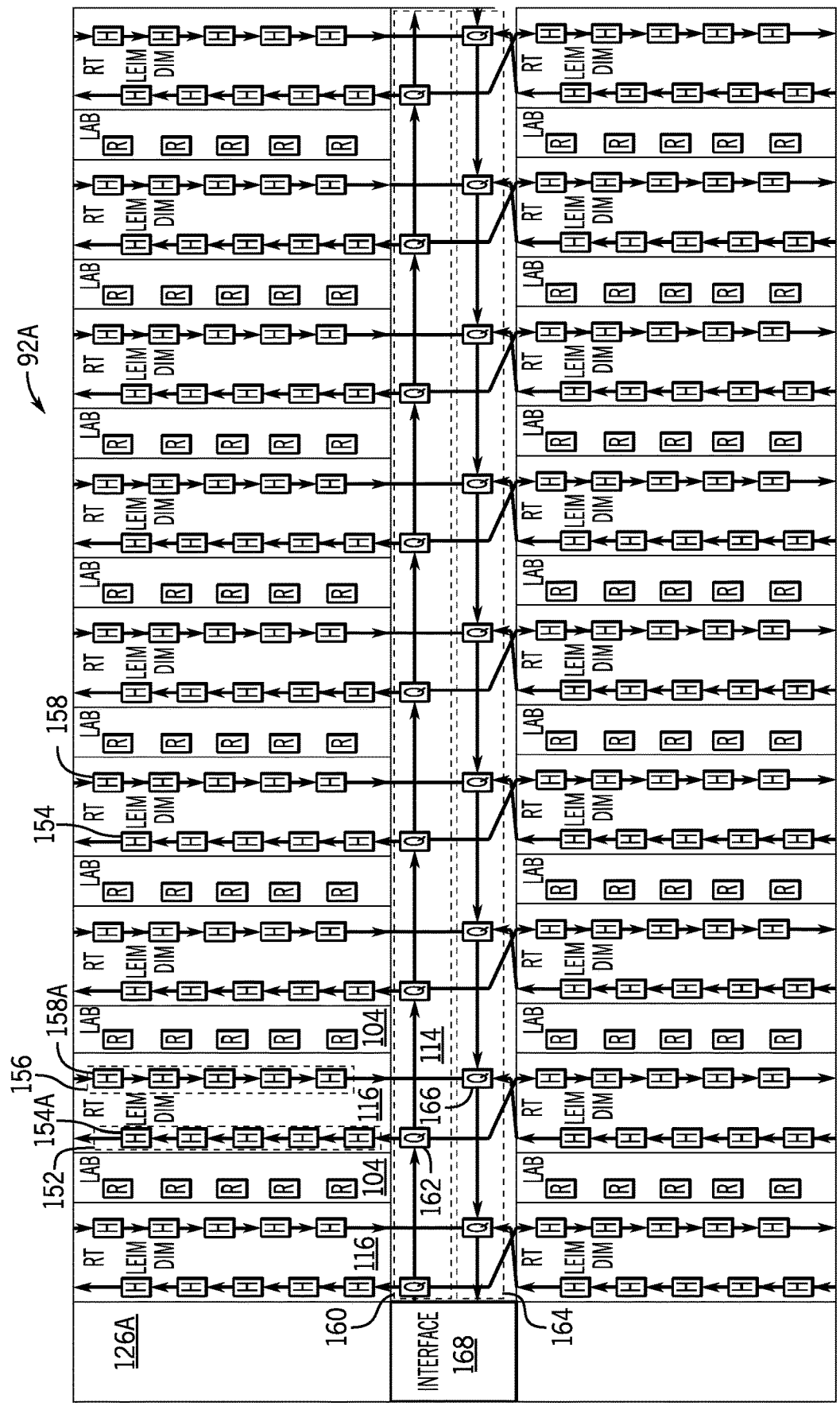
FIG. 9 is a block diagram of a microsector including logic element input mux (LEIM) highly pipelined (HIPI) registers and driver input mux (DIM) HIPI registers, in accordance with an embodiment.

To elaborate on data handling operations, FIG. 9 is block diagram of a microsector including logic element input mux (LEIM) HIPI registers 154 and driver input mux (DIM) HIPI registers 158. Routing fabric 116 may include any suitable number of LEIM HIPI registers 154 and any suitable number of DIM HIPI registers 158. LEIM HIPI registers 154 may be grouped into a LEIM HIPI register chain 152. Data in the LEIM HIPI register chain 152 may be shifted up from one LEIM HIPI register 154 to a subsequent LEIM HIPI register 154 in the LEIM HIPI register chain 152. At the end of the LEIM HIPI register chain 152, a final LEIM HIPI register 154 may shift data to a shift register 166 in a HIPI QDI Shift In path 164. Data may be shifted out from a shift register 162 in a HIPI QDI Shift Out path 160 to a first LEIM HIPI register 154 in the LEIM HIPI register chain 152. The data from shift register 162 may then be shifted up to a subsequent LEIM HIPI register 154 in the LEIM HIPI register chain 152.

DIM HIPI registers 158 may be grouped into a DIM HIPI register chain 156. Data in the DIM HIPI register chain 156 may be shifted down from one DIM HIPI register 158 to a subsequent DIM HIPI register 158 in the DIM HIPI register chain 156. At the end of the DIM HIPI register chain 156, a final DIM HIPI register 158 may shift data to a shift register 166 in the HIPI QDI Shift In path 164. Data may be shifted out from the shift register 162 in the HIPI QDI Shift Out path 160 to a first DIM HIPI register 158 in the DIM HIPI register chain 156. The data from shift register 162 may then be shifted down to a subsequent DIM HIPI register 158.

The row controller 126A may include an interface 168 and the interface 168 may receive data from the HIPI QDI Shift In path 164 and may transmit data to the HIPI QDI Shift Out path 160. In some embodiments, the interface 168 may convert data to be transmitted into a suitable number of data frames to be transmitted to the HIPI QDI Shift Out path 160. For example, the number of data frames may be based on the number of LEIM HIPI register chains 152 being written to and/or the number of DIM HIPI register chains 156 being written to.

Figure 10:
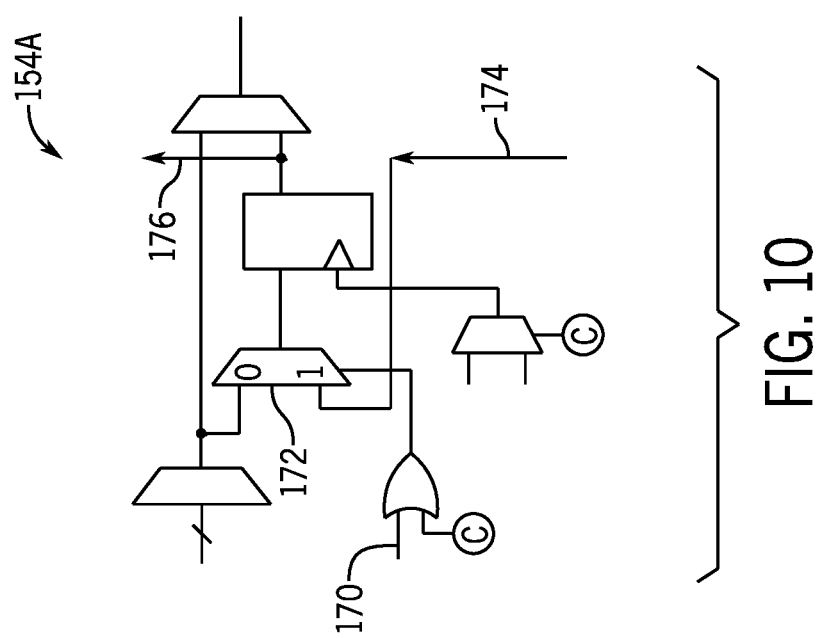
FIG. 10 is a block diagram of the LEIM HIPI register of FIG. 9, in accordance with an embodiment.

To elaborate on the LEIM HIPI register chain 152, FIG. 10 is a block diagram of a respective LEIM HIPI register 154. The LEIM HIPI register 154A may include any suitable combination of logic gate circuitry and/or serially shifting circuitry. For example, the LEIM HIPI register 154A may include one or more flip-flops, switch-reset latches, multiplexing circuitry or the like to enable the LEIM HIPI register 154A to shift data up to a subsequent LEIM HIPI register 154 in the LEIM HIPI register chain 152 associated with the microsector 92A or to a shift register 166 in the LCB 114. A LEIM shift enable signal 170 may be received at multiplexer 172 and may enable a shift mode of the LEIM HIPI register 154A. In the shift mode, a shift in data signal 174A may be received at the LEIM HIPI register 154A from a previous LEIM HIPI register 154 in the LEIM HIPI register chain 152 or a shift register 166. A shift out data signal 174B may be shifted out of LEIM HIPI register 154A to a subsequent LEIM HIPI register 154 or to a shift register 166. In some embodiments, the LEIM shift enable signal 170 may enable a shift mode in any suitable number of LEIM HIPI registers 154 in any suitable number of LEIM HIPI register chains 152. As such, data may be shifted up the LEIM HIPI register chain 152 until reaching a shift register 166 in the LCB 114.

Figure 11:
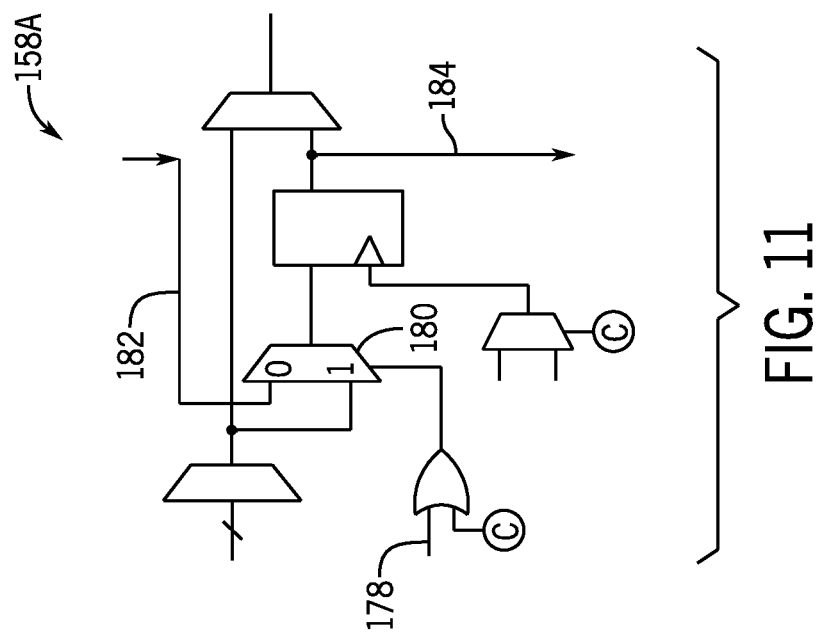
FIG. 11 is a block diagram of the DIM HIPI register of FIG. 9, in accordance with an embodiment.

To elaborate on the DIM HIPI register chain 156, FIG. 11 is a block diagram of a respective DIM HIPI register 158. The DIM HIPI register 158A may include any suitable combination of logic gate circuitry and/or serially shifting circuitry. For example, the DIM HIPI register 158A may include one or more flip-flops, switch-reset latches, multiplexing circuitry or the like to enable the DIM HIPI register 158A to shift data down to a subsequent DIM HIPI register 158 in the DIM HIPI register chain 156 associated with the microsector 92A or to a shift register 166 in the LCB 114. A DIM shift enable signal 178 may be received at multiplexer 180 and may enable a shift mode of the DIM HIPI register 158A. In the shift mode, a shift in data signal 182 may be received at the DIM HIPI register 158A from a previous DIM HIPI register 158 in the DIM HIPI register chain 156 or a shift register 166. A shift out data signal 184 may be shifted out of DIM HIPI register 158A to a subsequent DIM HIPI register 158 or to a shift register 166. In some embodiments, the DIM shift enable signal 178 may enable a shift mode in any suitable number of DIM HIPI registers 158 in any suitable number of DIM HIPI register chains 156. As such, data may be shifted down the DIM HIPI register chain 156 until reaching a shift register 166 in the LCB 114.

Figure 12:
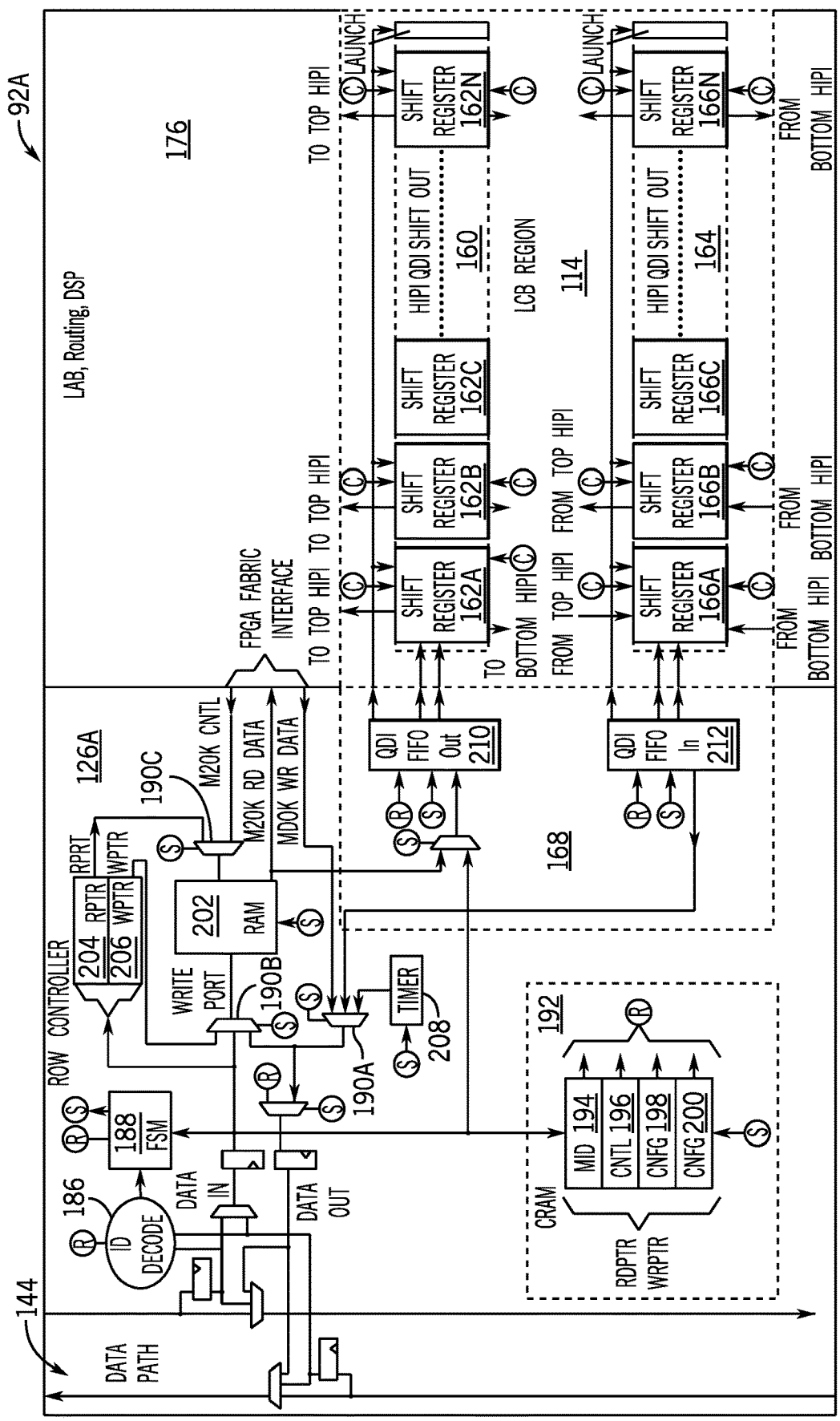
FIG. 12 is a block diagram of the row controller and the microsector of FIG. 8, in accordance with an embodiment.

To elaborate further on accessing the microsector 92, FIG. 12 is a block diagram of a respective row controller 126 and of a respective microsector 92. For ease of explanation, row controller 126A and microsector 92A are referenced. However, it should be understood that these descriptions are applicable to each row controller 126 and/or microsector 92.

The row controller 126 may receive the command from the LSM 130 via data path 144. Indeed, the LSM 130 may transmit commands as one or more packets (e.g., data packets) using the data path 144. It is noted that the command received via the data path 144 may be of any suitable format or length. An identifier decoder (ID Decode) block 186 may decode an identifier (ID) of the packet. By reading the ID of the packet and comparing to a stored ID indication, the ID Decode block 186 may identify whether the packet is relevant to the row controller 126A and/or whether the packet is intended to be received by the row controller 126A. The ID Decode block 186 may use one or more look-up tables, register values, and/or stored indications of its identifier. The data path 144 may be shared by each row controller 126 of a respective AR 106. As such, the data path 144 may also continue on to a subsequent row controller 126 of the AR 106A.

When the ID Decode block 186 identifies that a packet is for the row controller 126A, a finite state machine (FSM) 188 may perform logical sequencing to move the packet off of the data path 144. Register values received from the packet may be stored in configuration random access memory (CRAM) registers 192. It is noted that the CRAM registers 192 may be alternatively implemented in flip-flop circuitry or other logic circuitry, however CRAM-based registers may provide suitable memory storage capabilities to flip-lop circuitry or other logic circuitry while using a smaller footprint.

Register values may be referenced by other components throughout the row controller 126A. For example, from the packet, the FSM 188 and/or the ID Decode block 186 may receive signals indicative of register values (R). In response to the register values, the FSM 188 may generate a signal indicative of a state machine state (S). The state machine state may be maintained by the FSM 188, where a state of the FSM 188 may change in response to the register values (R) received from the CRAM registers 192 and/or in response to an output from the ID Decode block 186. The FSM 188 may output the state machine state (S) to the CRAM registers 192. The switching circuitry may change state to change a data path internal to the row controller 126A in response to the state machine state (S) output from the FSM 188.

Some of the CRAM registers 192 may not change in response to the packet being received by the row controller 126A. For example, identifier data stored in a controller identifier (ID) register 194 may be set at a time of initial configuration of the row controller 126A. However, if the row controller 126A is not preset with the identifier data stored in the ID register 194, the row controller 126A may set a value of the ID register 194 (e.g., the stored identifier) to an identifier included in the packet.

The CRAM registers 192 may include a control (CNTL) register 196 that stores control bits. The control bits may define how the row controller 126A interacts with the data path 144, such as how the row controller 126A is to receive and/or access a packet from the data path 144. For example, the control bits may indicate to the ID Decode block 186 which subset of packets are relevant to the row controller 126A and thus should be taken off of the data path 144. The CRAM registers 192 may also include a configuration (CNFG) register 198 used to store configuration bits. The configuration bits may transmit to the FSM 188 to change an operation of the row controller 126, such as an operation performed based on a state of the FSM 188. A mode register 200 may store configuration bits, for example, to define an operation for one or more of the row controllers 126. In some embodiments, the configuration bits may transmit to the Quasi Delay Insensitive (QDI) FIFO Out block 210 to change an operation of the row controller 126, such as indicating to the QDI FIFO Out block 210 an output frame size for converted data. For example, the output frame size may be based on the number of HIPI register columns written to. In certain embodiments, the configuration bits may transmit to the QDI FIFO In block 212 to change an operation of the row controller 126, such as indicating to the QDI FIFO In block 212 an input frame size for converted data. For example, the input frame size may be based on the number of HIPI register columns read from.

In some cases, a random-access memory (RAM) 202 of the row controller 126A may also receive the state machine state (S) generated by the FSM 188. The RAM 202 may be used as storage for the configuration operations. Since the RAM 202 includes volatile memory, the storage provided via the RAM 202 may be temporary storage. Packets from the data path 144 and/or packets to be transmitted to the data path 144 may be stored temporarily in the RAM 202 before and/or after transmission via the data path 144. Operations used to read from the RAM 202 may be based on data indicated by a Read Pointer (RPTR) block 204. Operations used to write to the RAM 202 may be based on data indicated by a Write Pointer (WPTR) block 206. The pointer indicated by the data of the RPTR block 204 may be used to advance an address provided to the RAM 202 as data is read from the RAM 202, thereby providing real-time adjustment of pointers used to access data stored by the RAM 202. It is noted that in cases when the RAM 202 is not included in the row controller 126A, supporting circuitry may also be omitted. For example, without the RAM 202, some switching circuitry (e.g., 190B, 190C) may be omitted as well as some or all of the FPGA fabric interface control signals since the data loading may be performed via transmit through the μDR 112. In some cases, the FSM 188 may control the addresses indicated by the RPTR block 204 and/or the WPTR 206 when moving data to or from the data path 144 and/or the FSM 188 may control the address indicated by the RPTR block 204 and/or the WPTR 206 when moving data to or from microsector 92A.

The row controller 126A may convert the address indicated by the WPTR block 206 to a one hot-decoded value (e.g., thermometer encoded value, 10000000, 00000001) by using a decoder block 186 (1 hot decode). The one-hot encoded value may be used to select a CRAM to be written or read. It is noted that with one-hot encoded values, an integer value, such as an address or another integer encoded variable, may be replaced (e.g., translated) into a new binary variable, where a binary value (e.g., logical low bit, "0" or a logical high bit, "1" as is in the case of 111110 encoding) may added for each unique integer value. In this way, an address of ten may be represented by "0000000001" or "1111111110," while an address of four may be represented by "0001" or "1110," based on whether the encoding is using a "1" or a "0" to represent the various integer values. Other formats may be used based on the particular system implementation.

The row controller 126A may also include a Quasi Delay Insensitive (QDI) FIFO Out block 210 (QDI FIFO OUT). The QDI FIFO Out block 210 may convert data received over the data path 144 into any suitable number of data frames, such that the data frames may be serially shifted to the HIPI QDI Shift Out path 160 that may include individual shift registers 162 (e.g., shift register 162A, shift register 162B, shift register 162C, shift register 162N) serially coupled.

Each shift register 162 may include any suitable combination of logic gate circuitry and/or serially shifting circuitry. For example, the shift register 162 may include one or more flip-flops, switch-reset latches, multiplexing circuitry or the like to enable the row controller 126A to shift data into the respective programmable logic 66 (e.g., disposed in region 176) associated with the microsector 92A. Indeed, the region 176 of the programmable logic 66 corresponding to the microsector 92A may include the LABs 104, the ALEs 110, the LCBs 114, and/or the routing fabric 116 described above with regards to at least FIG. 6.

The row controller 126A may also include a QDI FIFO In block 212 (QDI FIFO IN). The QDI FIFO In block 212 may convert data frames received from the HIPI QDI Shift In path 164 into data portions matching a width of the data path 144, such that the data frames may be serially shifted from the HIPI QDI Shift In path 164 that may include individual shift registers 166 (e.g., shift register 166A, shift register 166B, shift register 166C, shift register 166N) serially coupled.

Each shift register 166 may include any suitable combination of logic gate circuitry and/or serially shifting circuitry. For example, the shift register 166 may include one or more flip-flops, switch-reset latches, multiplexing circuitry or the like to enable the row controller 126A to shift data out of the respective programmable logic 66 (e.g., disposed in region 176) associated with the microsector 92A.

In certain embodiments, the FSM 188 may receive signals indicative of a command to read and/or write the QDI FIFO Out block 210 and/or the QDI FIFO In block 212. The row controller 126A may also include a timer block 208. The timer block 208 may be synchronized. The timer block 208 may include a suitable number of bits to count a maximum variation in latency of data arriving at the trace trigger buffer 250. The timer block 208 may generate and may transmit a timer value to that is sent with each trace data packet in the data path 144. The trace trigger buffer 250 may receive the timer value and may determine a time an associated trace data packet was generated.

Figure 13:
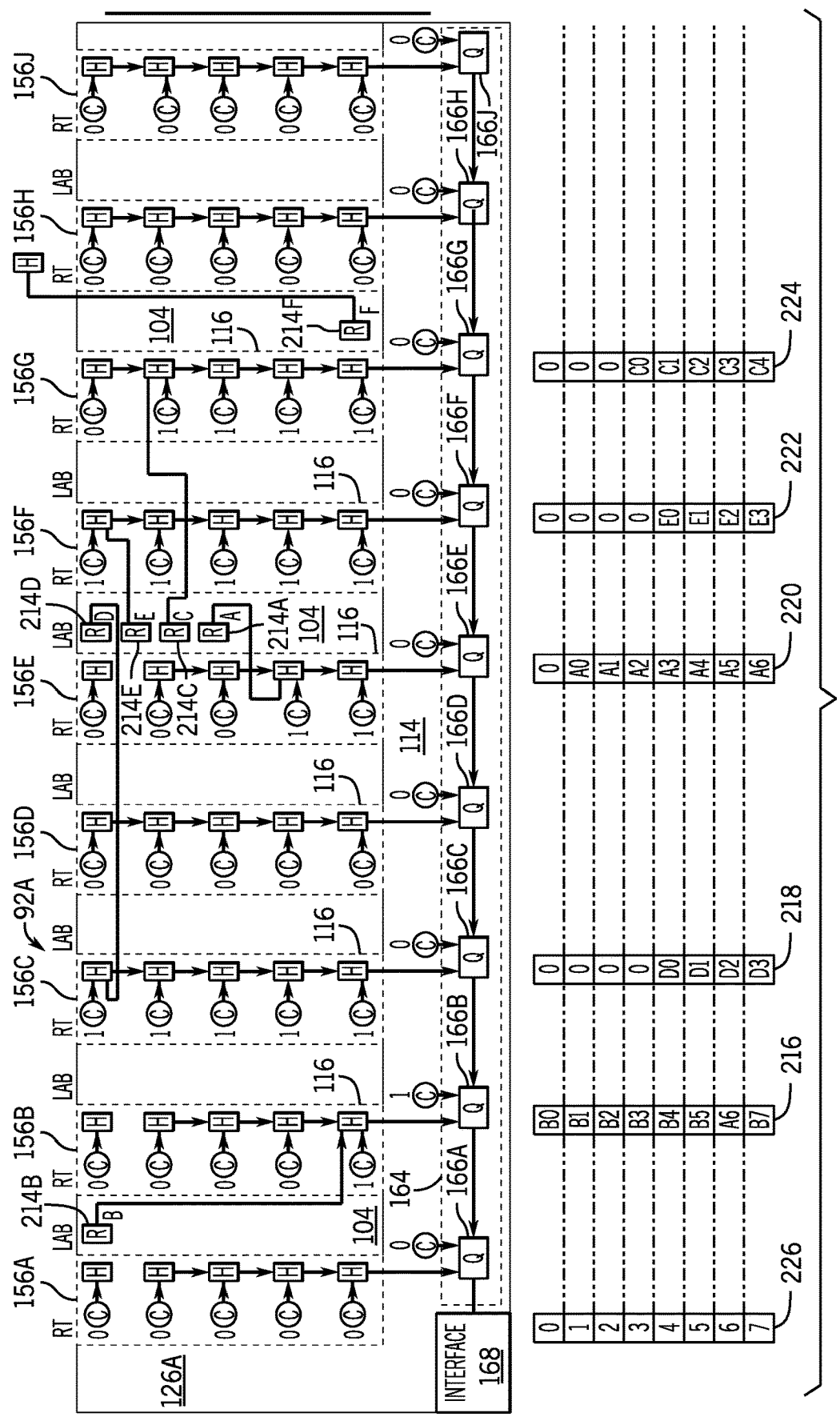
FIG. 13 is a block diagram of the microsector of FIG. 8, in accordance with an embodiment.

Referring now to more details regarding the HIPI QDI Shift In path 164, FIG. 13 is a block diagram of a portion of the microsector 92A of FIG. 9. Microsector 92A may include any suitable number of LABs 104. Each LAB 104 may include one or more user registers 214 (e.g., user register 214A, user register 214B, user register 214C, user register 214D, user register 214E, user register 214F). While six user registers 214 are shown in FIG. 13, any suitable number of user registers 214 may be present in microsector 92A. The microsector 92A may also include any suitable number of DIM HIPI register chains 156 (e.g., 156A, 156B, 156C, 156D, 156E, 156F, 156G 156H, 156J). Each user register 214 may be communicatively coupled to an associated DIM HIPI register chain 156.

The microsector 92A may also include any suitable number of shift registers 166 (e.g., 166A, 166B, 166C, 166D, 166E, 166F, 166G, 166H, 166J) in the HIPI QDI Shift In path 164. For example, the microsector 92A may have an equal or greater number of shift registers 166 as the number of DIM HIPI register chains 156. Each DIM HIPI register chain 156 may be communicatively coupled to an associated shift register 166 in the HIPI QDI Shift In path 164. The HIPI QDI Shift In path 164 may shift data from the DIM HIPI register chains 156 to the interface 168. The shift registers 166 of the HIPI QDI Shift In path 164 may operate at a frequency greater than a frequency at which the user registers 214 operate. As such, the HIPI QDI Shift In path 164 may shift a number of bits from the shift registers 166 based on a ratio of the frequency of the shift registers 166 and the frequency of the user registers 214. For example, if the shift registers 166 operate at 5 GHz and the user registers 214 operate at 1 GHz, the HIPI QDI Shift In path 164 may shift five bits to the interface 168 during every clock cycle. As such, only five shift registers (166B, 166C, 166E, 166F, 166G) may be active and may shift out bits to the interface 168.

Column 226 shows clock cycles 0, 1, 2, 3, 4, 5, 6, and 7. Bit columns 216, 218, 220, 222, and 224 show bits associated with corresponding clock cycles for each of the active shift registers 166. On every clock cycle, data shifts from one DIM HIPI register 156 in DIM HIPI register chains 156B, 156C, 156E, 156F, 156G to an associated active shift register 166 in the HIPI QDI Shift In path 164. For example, during clock cycle 0, shift register 166B receives data B0 from DIM HIPI register chain 156B, shift registers 166C, 166E, 166F, and 166G receive a bit value of zero from DIM HIPI register chains 156C, 156E, 156F, and 156G, respectively.

While FIG. 13 is described in relation to DIM HIPI register chains 156, shift registers 166, and HIPI QDI Shift In path 164, LEIM HIPI register chains 152 may function with HIPI QDI Shift In path 164 in a similar manner. Additionally, shift registers 162 and HIPI QDI Shift Out path 160 may function in a similar manner with LEIM HIPI register chains 152 and DIM HIPI register chains 156 with bits being shifted from HIPI QDI Shift Out path 160 to the register chains 152, 156.

Figure 15:
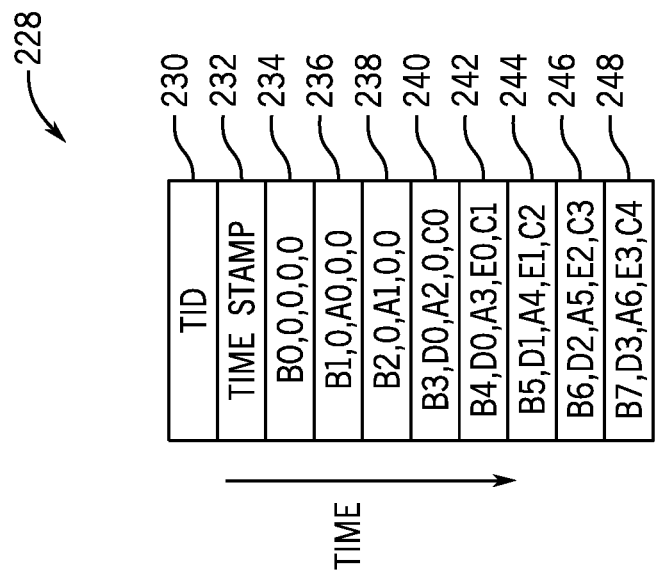
FIG. 15 is an illustration of a data message associated with the micro-network-on-chip data path of FIG. 8, in accordance with an embodiment.
Figure 14:
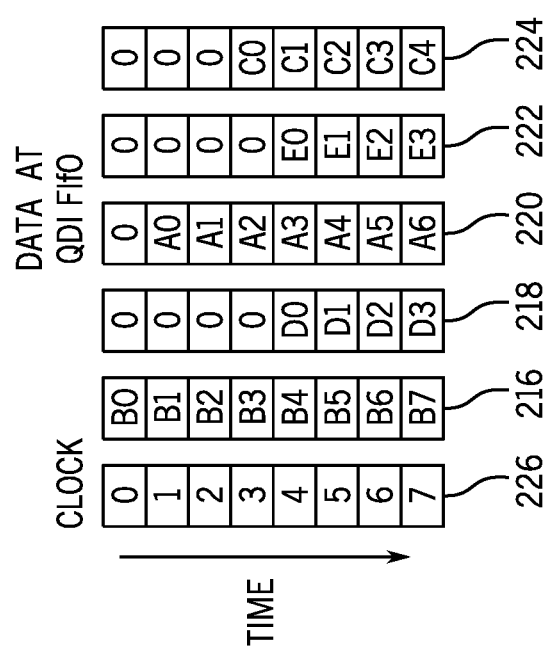
FIG. 14 is an illustration of trace data arriving at the QDI FIFO of FIG. 13, in accordance with an embodiment.

FIG. 14 is an illustration of data received at the QDI FIFO In block 210 of FIG. 12 via the interface 168. Bit columns 216, 218, 220, 222, 224 show bits shifted out from associated active shift registers 166B, 166C, 166E, 166F, and 166G, respectively, in FIG. 13. FIG. 15 is an illustration of a MNOC message 228 generated by converting the bits received at the QDI FIFO In block 210. MNOC message 228 may include a Traffic Identifier (TID) 230 used to identify a respective microNOC 142. The TID 230 may correspond to a logical address of the respective microNOC 142 (e.g., to guide a routing network as to where to direct a message). In certain embodiments, the TID 230 may indicate a respective microNOC responsible for generating the MNOC message 228. A time stamp 232 may indicate when the MNOC message 228 was created and/or generated. The interface 168 and/or QDI FIFO In block 210 may also arrange the bits according to how the interface 168 and/or QDI FIFO In block 210 received the data from the active shift registers 166B, 166C, 166E, 166F, and 166G. For example, the interface 168 and/or QDI FIFO In block 210 may arrange the bits according to the clock cycle during which the interface 168 received the bits. As such, bit group 234, 236, 238, 240, 242, 244, 246, 248 may correspond to clock cycles 0, 1, 2, 3, 4, 5, 6, 7, respectively.

Figure 16:
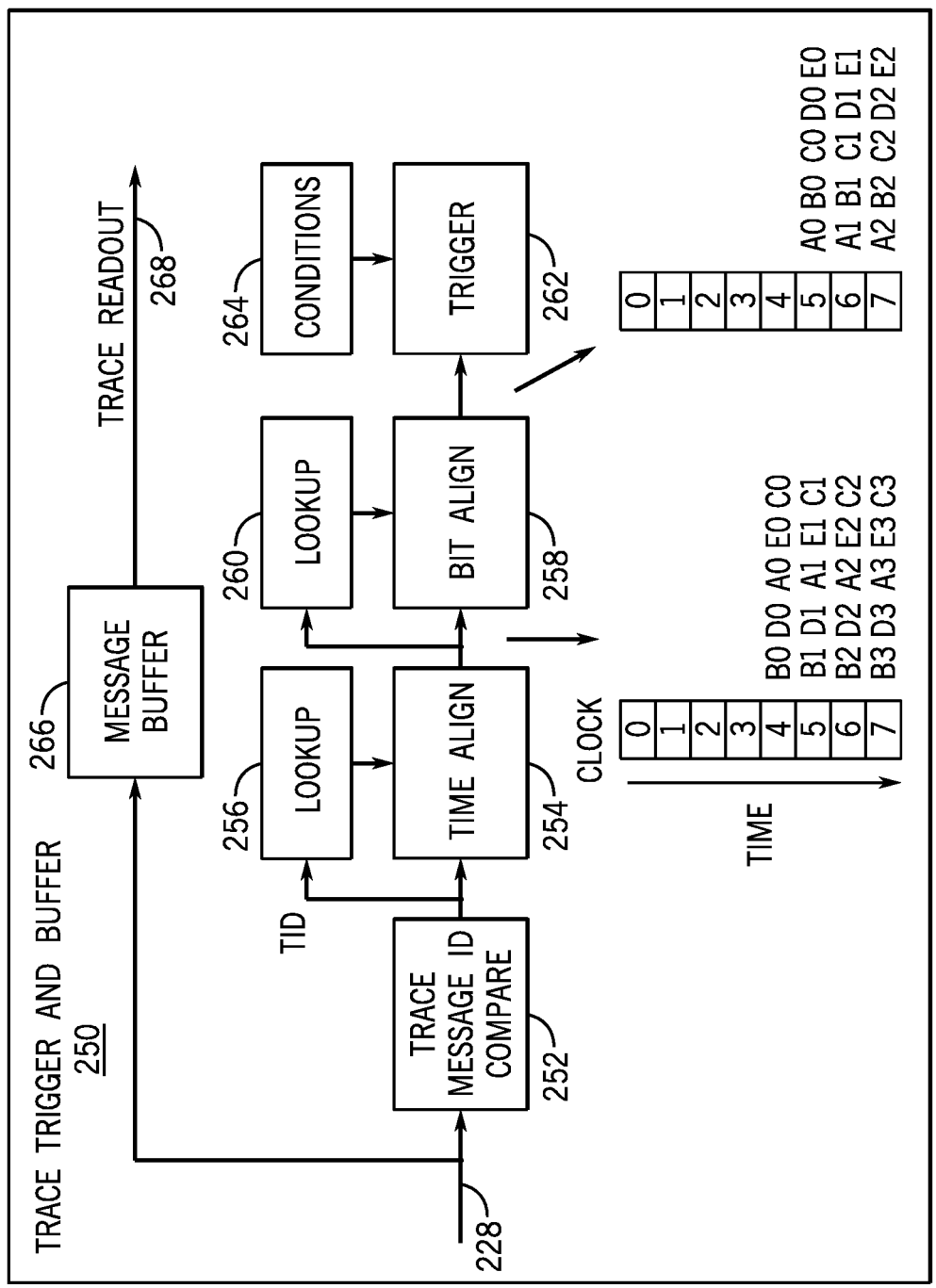
FIG. 16 is a block diagram of a trace buffer trigger, in accordance with an embodiment.

Referring now to FIG. 16, the trace buffer trigger 250 may receive any suitable number of MNOC messages 228. The trace buffer trigger 250 may store MNOC messages 228 in temporary message buffer 266. The trace buffer trigger 250 may send MNOC messages 228 out as trace 268. The trace buffer trigger 250 may include a message ID compare block 252, time align block 254, lookup 256, bit align block 258, lookup 260, trigger 262, conditions 264, and message buffer 266. The purpose of all these blocks is to reconstruct cycle-by-cycle view of multiple bits received in MNOC message 228. Time align block 254 may align a local time stamp embedded in a received MNOC message 228 to a global timing view. Bit align block 258 may unpack bits from the received MNOC message 228 and may align bits from different registers to the same timeline and may further re-order bits from a least significant bit (LSB) to a most significant bit (MSB) order. Finally, trigger block 262 may align values to the trigger condition (e.g., conditions 264) and may generate appropriate trigger signals.

Microregion Dynamic Voltage Frequency Scaling (DVFS) and Security Techniques

To incorporate dynamic voltage and frequency scaling techniques in programmable integrated circuits, the critical paths of each region of the integrated circuit may be identified based on an analysis of a user's design of each region of the integrated circuit. After identifying the critical paths of an integrated circuit based on the user design, the embodiments described herein may include creating synthetic tunable replica circuits (STRCs) that mimic the identified critical paths. The created STRCs may be programmed into unused FPGA logic and circuit components of the integrated circuit based on the user's design. In some embodiments, the insertion of the STRCs into the integrated circuit may involve simultaneously inserting the STRCs with the user's circuit design if there is not enough unused logic to create them.

After an STRC is stored in a region of the integrated circuit, a control circuit within the respective region of the integrated circuit may tune or calibrate the STRC to represent the critical paths of the respective region. In some embodiments, a calibration design may be created to calibrate the STRCs with respect to the real critical paths of the actual circuit paths of the user's circuit design. The calibration design may include heater circuits, such that the STRCs may be swept across various voltages, frequencies, and temperature values. After tuning the STRC, the control circuit may monitor the performance of the STRC over a frequency sweep and record the behavior of the critical path over frequency. As a result, the control circuit may generate a table that quantifies the behavior of the critical path over frequency without knowledge of the voltage and temperature characteristics of the region of the integrated circuit.

With the foregoing in mind, while the region of the integrated circuit is performing a respective operation via its critical path, the control circuit may determine whether the clocking frequency or voltage provided to the region may be reduced without compromising the region's performance based on the recorded behavior. Based on the recorded behavior, the control circuit may adjust the clocking frequency of the region to reduce the overall power consumed by the integrated circuit. In addition to reducing the power consumption of the integrated circuit, the control circuit may employ STRCs to detect anomalies that may occur within the integrated circuit, detect attacks from perpetrators outside of the integrated circuit, improve end-of-life parameters for the integrated circuit, and the like.

Figure 17:
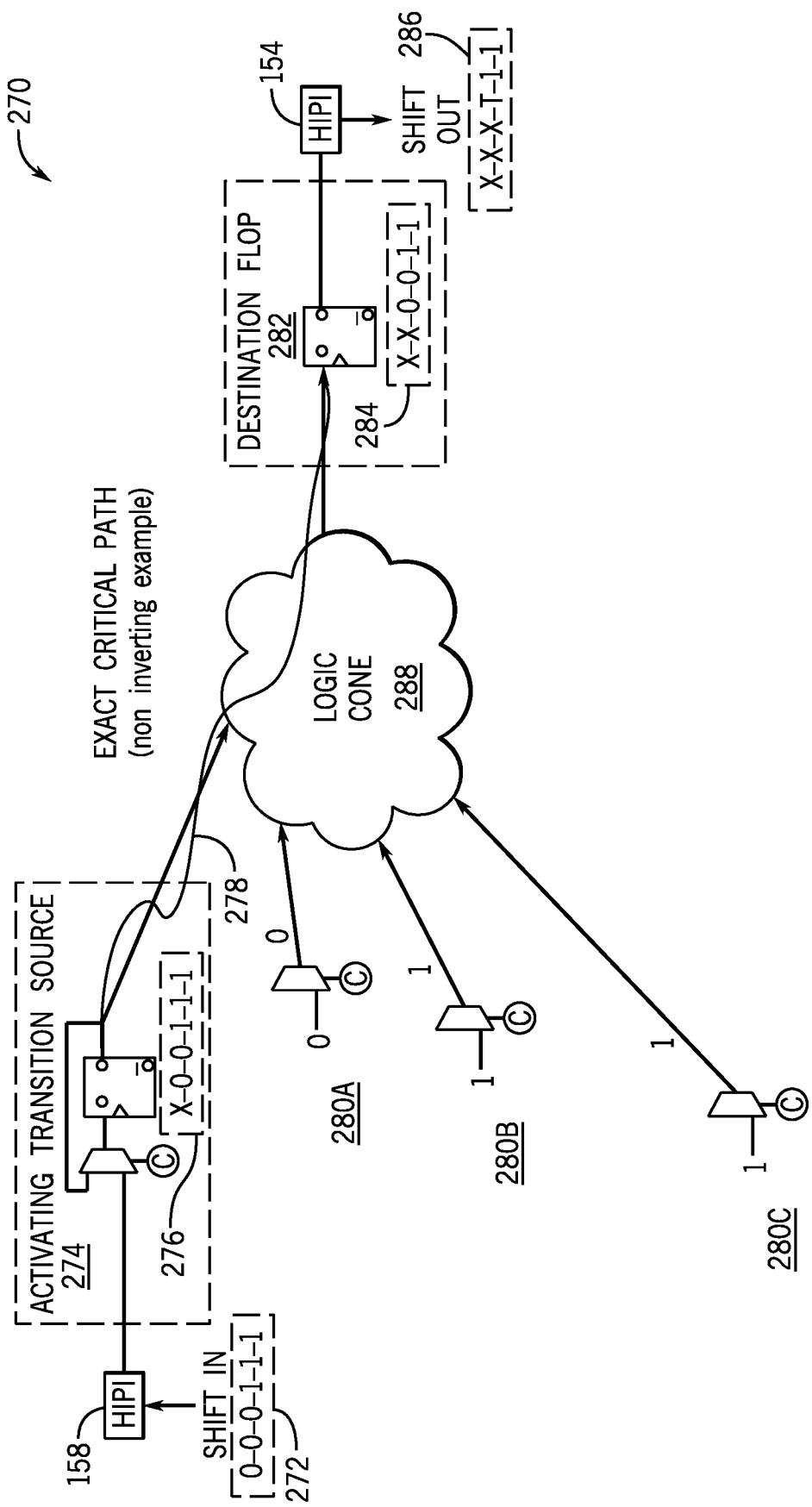
FIG. 17 is an illustration of sensitizing and activating a critical path of programmable logic of the integrated circuit of FIG. 1, in accordance with an embodiment.

FIG. 17 illustrates a block diagram of a system 270 for sensitizing a logic cone 288. To sensitive the logic cone 288, an activating source 274 causes an input logic to transition and travels along critical path 278 to cause destination flop 282 to transition. Input bit sequence 272 may be shifted into the DIM HIPI register 158. The input bit sequence 272 may include bit values that are shifted at a slow clock frequency and bit values that are shifted at a maximum clock frequency (FMAX). The DIM HIPI register 158 may transmit the input bit sequence 272 to the activating source 274. The activating bit sequence 276 may include bit values that are shifted at the slow clock frequency and bit values that are shifted at the maximum clock frequency. In certain embodiments, the activating bit sequence may include bit values which are unknown (e.g., X). In response, the activating source 274 may initialize a bit sequence 284 of the destination flop 282 to a bit value opposite of the desired transition. The activating source 274 may initialize the activating bit sequence 276 to a bit value opposite of the desired source transition. The activating source 274 may also create the desired transition at an output of the activating source 274. The activating source 274 may also create the transition to be measured at the destination flop 282 at the desired maximum frequency. The LEIM HIPI register 154 may shift out data (e.g., bit sequence 286). The bit sequence 286 may include unknown bit values and a transition bit value being tested for (e.g., T). In certain embodiments, the activating signal may be a vector instead of a bit sequence.

Figure 18:
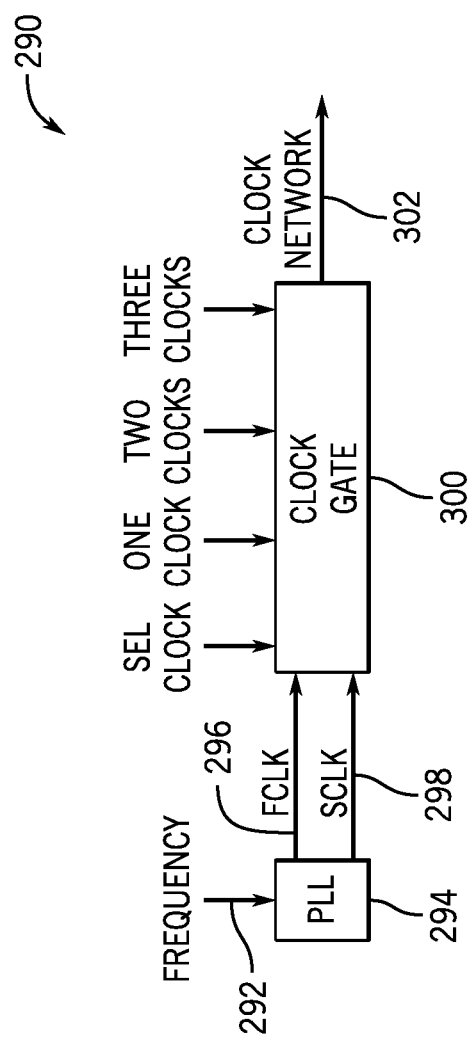
FIG. 18 is a block diagram of a clock control circuit, in accordance with an embodiment.

Referring now to more details regarding critical paths, FIG. 18 is a block diagram of a clock control circuit 290 for a clock network. The clock control circuit 290 may select either a fast clock (FCLK) signal 296 (e.g., the FMAX clock signal) or a slow clock (SCLK) signal 298 as the clock source for sensitizing and activating the critical path. The clock control circuit 290 may include a phase-locked loop block 294 that receives input clock frequency signal 292 and that generates the fast clock signal 296 and the slow clock signal 298, based on the input clock frequency signal 292. The clock gate block 300 may select the fast clock signal 296 or the slow clock signal 298 as output clock signal 302 to the clock network.

Figure 19:
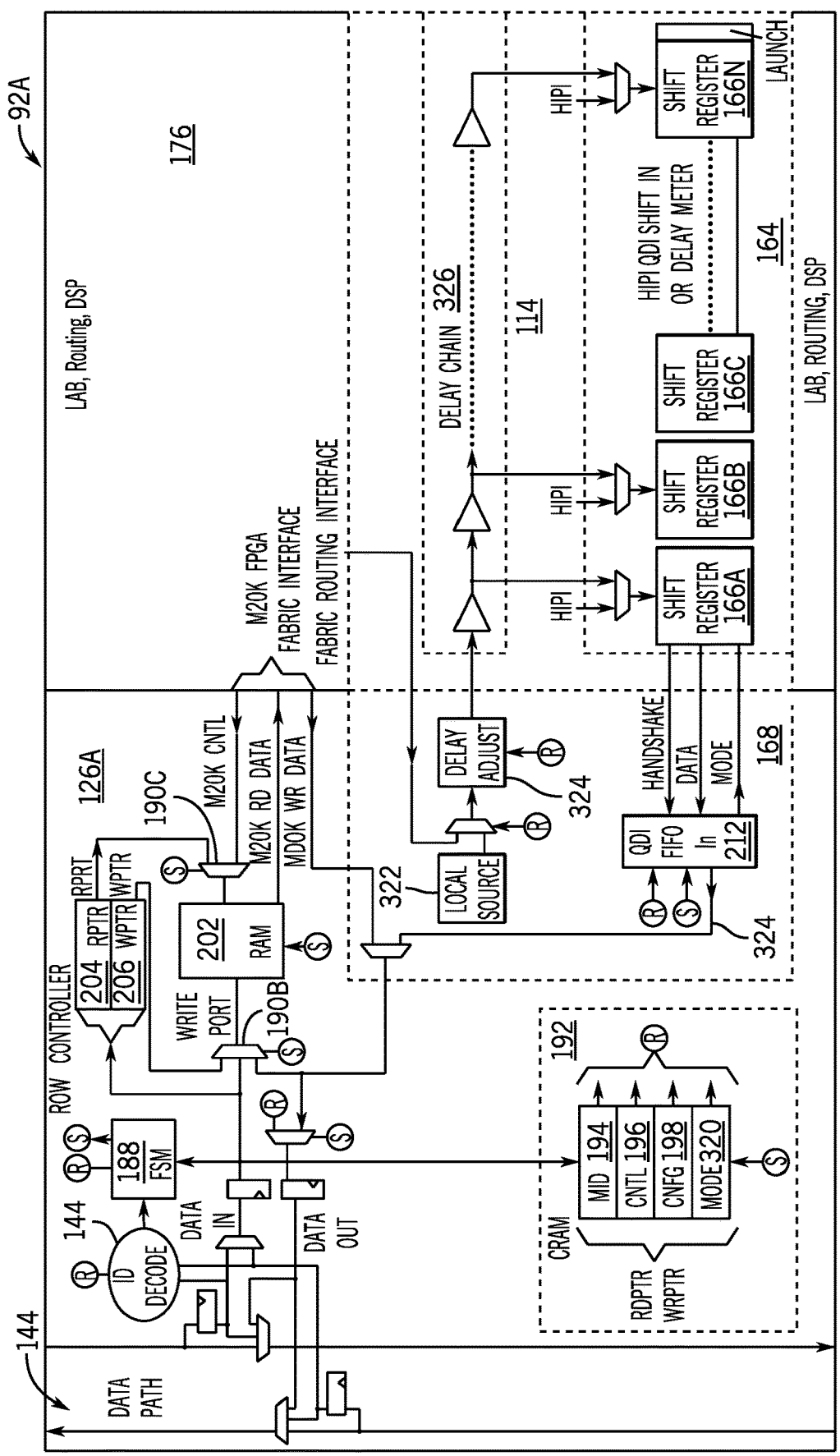
FIG. 19 is a block diagram of the row controller and the microsector of FIG. 8 having a delay meter, in accordance with an embodiment.

To elaborate further on DFVS techniques on the microsector 92, FIG. 19 is a block diagram of a respective row controller 126 and of a respective microsector 92. The microsector 92A may also include a delay chain 326 that may provide a bit value (e.g., 0-16 bits) that represents the current delay of the identified critical path. The delay chain 326 may be used as a reference to determine whether the identified critical path delay is increasing or decreasing over time. The QDI FIFO In block 212 may generate a delay meter signal 338 based on data received from the HIPI QDI Shift In path 164 (e.g., the delay meter). For example, the QDI FIFO In block 212 may receive meter data indicative of the behavior (e.g., delay time) of the critical path of the STRC via the HIPI QDI Shift In path 164. The FSM 188 may receive the delay meter signal 338 from the QDI FIFO In block 212

The CRAM registers 192 may include a mode register 320 that stores configuration bits. For example, the configuration bits may define an operation for one or more of the row controllers 126. In some embodiments, the configuration bits may transmit to the local source block 322 to change an operation of the row controller 126, such as indicating a local source block 322 to be used for a measured signal and the clock the local source is launched on. In certain embodiments, the configuration bits may transmit to the delay adjust block 324 to change an operation of the row controller 126, such as monitoring and centering a delay edge in the delay meter (e.g., HIPI QDI Shift In path 164).

Figure 20:
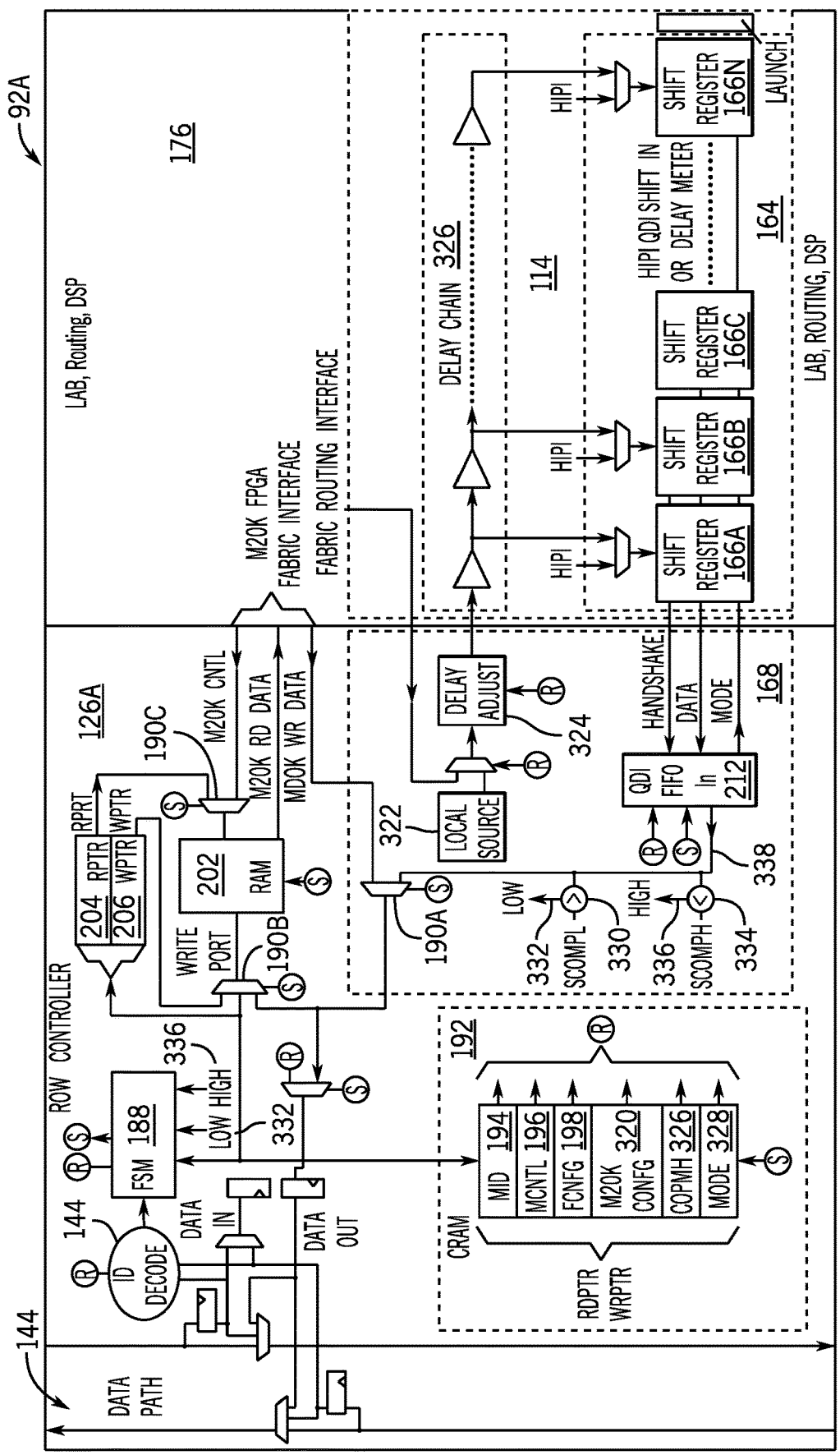
FIG. 20 is a block diagram of the row controller and the microsector of FIG. 8 having high and low comparison registers, in accordance with an embodiment.

To elaborate further on security techniques on the microsector 92, FIG. 20 is a block diagram of a respective row controller 126 and of a respective microsector 92. A less than circuit block 330 may compare the delay meter signal 338 from the QDI FIFO In block 212 to a first threshold delay value (e.g., a lower threshold delay value). For example, the less than circuit block 330 may determine the delay meter signal 338 falls below the first threshold delay value. As such, the less than circuit block 330 may generate a low alarm signal 332 based on the comparison and may transmit the low alarm signal 332 to the FSM 188. A greater than circuit block 334 may compare the delay meter signal 338 to a second threshold delay value (e.g., a greater threshold delay value). For example, the greater than circuit block 334 may determine the delay meter signal 338 is greater than the second threshold delay value. As such, the greater than circuit block 334 may generate a high alarm signal 336 based on the comparison and may transmit the high alarm signal 336 to the FSM 188.

In some embodiments, the FSM 188 may perform an operation in response to receiving an alarm signal (e.g., low alarm signal 332, high alarm signal 336). For example, the FSM 188 may generate and may transmit the alarm signal to a secure device manager for the integrated circuit 12. The alarm signal may include an indication of a microsector 92 associated with the alarm signal, the first threshold delay value, the second threshold delay value, and/or the delay meter signal 338. In certain embodiments, the secure device manager may perform an operation in response to receiving the indication from the FSM. For example, the secure device manager may shut down the integrated circuit 12, shut down the corresponding microsector 92A based on the indication in the alarm signal, remove power from the corresponding microsector 92A, gate the I/O of the corresponding microsector 92A based on the indication in the alarm signal, or the like.

The CRAM registers 192 may include a low comparison register 326 that stores configuration bits. For example, the configuration bits may transmit to the FSM 188 to change an operation of the row controller 126, such as an operation performed based on a state of the FSM 188. The configuration bits may transmit to the less than circuit block 330 to change an operation of the row controller 126, such as generating a lower threshold delay value and comparing the lower threshold delay value to the delay meter signal 338 from the HIPI QDI Shift In path 164.

A high comparison register 328 in the CRAM registers 192 may store configuration bits. For example, the configuration bits may transmit to the FSM 188 to change an operation of the row controller 126, such as an operation performed based on a state of the FSM 188. The configuration bits may transmit to the greater than circuit block 334 to change an operation of the row controller 126, such as generating the greater threshold delay value and comparing the greater threshold delay value to the delay meter signal 338 from the HIPI QDI Shift In path 164.

Referring briefly to design and compilation operations, a compiler 16, host 18, and/or design software 14 may know which register-transfer level (RTL) soft logic is used to implement circuitry applications in the programmable logic 66. The compiler 16, the host 18, and/or the design software 14 may use this information to configure a master bridge of the NOC 146 with identifiers for used row controllers 126 and/or microNOCs 142. The compiler 16, the host 18, and/or the design software 14 may also use this information to generate a name to use to address the include file. At the time the RTL is written, the design software 14, for example, may use placeholder blocks with defined data sources and data end points but without defined memories and logic placement. During compilation, an "include file" may be generated that includes memories and logic placement to implement the operations to be performed by the placeholder blocks. An include file may include one or more named associations between logical memory inferenced (or instantiated in RTL) and addresses. The compiler 16, the host 18, and/or the design software 14 may generate the include file in an RTL analyze phase of compilation operations. For example, the include file may be generated when defining a memory map to guide future memory transactions with the programmable logic 66. The master bridge of the NOC 146 supporting the command interface may provide translation to the physical CM 132. The include file may provide the logical address of the CM 132. The compiler 16, the host 18, and/or the design software 14 may generate a NOC logical-to-physical address translation table after design fitting operations, and may store the translation table in the master bridge as part of device configurations.

During a design phase, a visualization tool associated with the design software 14 may show physical placement of the row controllers 126 in a design. The visualization tool may also show an impact on timing that the row controller placement has on the design, as well as an expected bandwidth or latency. The timing, bandwidth, and/or latency metrics may be shown for the design as a whole, for portions of the design in comparison to each other, or the like. With the visualization tool, a user may perform manual placement of row controllers 126 to determine an impact of the placement. The impact of the placement may not be reflected in the presented metrics until after a re-compilation of the design.

While the embodiments set forth in the present disclosure may be susceptible to various modifications and alternative forms, specific embodiments have been shown by way of example in the drawings and have been described in detail herein. For example, any suitable combination of the embodiments and/or techniques described herein may be implemented. Moreover, any suitable combination of number formats (e.g., single-precision floating-point, half-precision floating-point, bfloat16, extended precision and/or the like) may be used. Further, each DSP circuitry and/or DSP architecture may include any suitable number of elements (e.g., adders, multipliers 64, routing, and/or the like). Accordingly, it should be understood that the disclosure is not intended to be limited to the particular forms disclosed. The disclosure is to cover all modifications, equivalents, and alternatives falling within the spirit and scope of the disclosure as defined by the following appended claims.

Technical effects of the present disclosure include system and methods that provide a microsector architecture. The microsector architecture described herein may benefit operations of programmable logic devices, such as field programmable gate arrays and/or other configurable devices, by permitting programming of programmable fabric to occur over smaller regions of fabric. The systems and methods described herein may enable a 1-bit wide data register (e.g., a micro-data register (μDR)) to transmit data to or from the smaller regions of programmable fabric. Benefits afforded from the microsector architecture may be further improved from using a micro-network-on-chip (microNOC) in conjunctions with the microsector. Each microsector corresponds to a row controller, and row controllers communicate with a control system via a shared data path. The control system may improve data transactions within the microsector architecture by coordinating data read and write operations across one or more microNOCs and across one or more row controllers. Coordinating operations spanning the microsector architecture enables large-scale data movements between the memory within the microsector architecture components and external memory. Furthermore, an addressing process is described herein that enables each row controller and/or each microNOC to be respectively addressed. These system and methods that enable individualized addressing of microNOCs may improve data handling operations since data may be stored out of logical order within the microsector architecture.

EXAMPLE EMBODIMENTS

EXAMPLE EMBODIMENT 1. An integrated circuit, comprising:
a first network-on-chip disposed around at least a partial perimeter of a plurality of microsectors arranged in a row and column grid; and
a first microsector of the plurality of microsectors, wherein the first microsector is coupled to a first row controller, the first microsector comprising:
a plurality of logic access blocks, each logic access block coupled to a data register;
a plurality of routing blocks, each routing block comprising a first HIPI register chain and a second HIPI register chain, wherein at least one data register is coupled to at least one of the first HIPI register chain and the second HIPI register chain; and
a control block comprising a first shift register chain configurable to shift data out of the first microsector to the first row controller and a second shift register chain configurable to shift data in to the first microsector from the first row controller.

EXAMPLE EMBODIMENT 2. The integrated circuit of example embodiment 1, wherein the first shift register chain comprises a plurality of shift registers.

EXAMPLE EMBODIMENT 3. The integrated circuit of example embodiment 2, wherein a portion of the plurality of shift registers are inactive shift registers.

EXAMPLE EMBODIMENT 4. The integrated circuit of example embodiment 1, the first row controller comprising a first control circuit configurable to receive data from the first shift register chain.

EXAMPLE EMBODIMENT 5. The integrated circuit of example embodiment 4, the first row controller comprising a second control circuit configurable to shift data to the second shift register chain.

EXAMPLE EMBODIMENT 6. The integrated circuit of example embodiment 4, wherein the first control circuit is configurable to convert data received from the first shift register chain from a number of data frames to a data format associated with the first row controller.

EXAMPLE EMBODIMENT 7. The integrated circuit of example embodiment 5, wherein the second control circuit is configurable to convert data into a number of data frames.

EXAMPLE EMBODIMENT 8. The integrated circuit of example embodiment 1, wherein a number of bits shifted out from the first shift register chain is based on a frequency of the data register and a frequency of a shift register of the first shift register chain.

EXAMPLE EMBODIMENT 9. A method, comprising:
monitoring, via a first control circuit, a propagation delay associated with a delay chain disposed in programmable logic circuitry of an integrated circuit, wherein the first control circuit is disposed outside programmable logic circuitry of the integrated circuit;
comparing, via the first control circuit, the propagation delay to a first threshold delay;
determining, based on the comparison, that at least one alarm signal criteria is met; and
in response to determining at least one alarm signal criteria is met, generating an alarm signal based on the comparison.

EXAMPLE EMBODIMENT 10. The method of example embodiment 9, comprising:
receiving, at a second control circuit disposed outside the programmable logic circuitry, the alarm signal; and
generating, based on the alarm signal, a message comprising an identifier of a microsector of the programmable logic circuitry.

EXAMPLE EMBODIMENT 11. The method of example embodiment 10, comprising performing an operation based on the message.

EXAMPLE EMBODIMENT 12. The method of example embodiment 11, wherein the operation comprises turning off power to the microsector.

EXAMPLE EMBODIMENT 13. The method of example embodiment 9, wherein:
the first threshold delay is a minimum threshold delay; and comparing the propagation delay to the first threshold delay comprises determining that the propagation delay falls below the minimum threshold delay.

EXAMPLE EMBODIMENT 14. The method of example embodiment 9, comprising:

comparing, via the first control circuit, the propagation delay to a second threshold delay;

determining, based on the comparison to the second threshold delay, that at least one alarm signal criteria is met; and in response to determining at least one alarm signal criteria is met, generating a second alarm signal based on the comparison to the second threshold delay.

EXAMPLE EMBODIMENT 15. The method of example embodiment 14, wherein:

the second threshold delay is a maximum threshold delay; and comparing the propagation delay to the second threshold delay comprises determining that the propagation delay exceeds the maximum threshold delay.

EXAMPLE EMBODIMENT 16. A system, comprising:

programmable logic circuitry comprising a plurality of configuration memory, the programmable logic circuitry comprising:

a first microsector, wherein the first microsector is coupled to a first row controller, the first microsector comprising:

a plurality of logic access blocks, each logic access block coupled to a data register;

a plurality of routing blocks, each routing block comprising a first HIPI register chain and a second HIPI register chain, wherein at least one data register is coupled to at least one of the first HIPI register chain and the second HIPI register chain; and a control block comprising a first shift register chain configurable to shift data out of the first microsector to the first row controller; and a first control circuitry, wherein the first control circuitry is configured to receive data from the first shift register chain.

EXAMPLE EMBODIMENT 17. The system of example embodiment 16, the control block comprising second shift register chain configurable to shift data in to the first microsector from the first row controller.

EXAMPLE EMBODIMENT 18. The system of example embodiment 17, comprising a second control circuitry, wherein the second control circuitry is configured to shift data to the second shift register chain.

EXAMPLE EMBODIMENT 19. The system of example embodiment 18, wherein the first control circuitry and the second control circuitry are disposed in the first row controller.

EXAMPLE EMBODIMENT 20. The system of example embodiment 18, wherein the second control circuitry is configured to convert data into a number of data frames.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function]. . ." or "step for [perform]ing [a function]. . ." it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An integrated circuit, comprising:
a first network-on-chip disposed around at least a partial perimeter of a plurality of microsectors arranged in a row and column grid; and
a first microsector of the plurality of microsectors, wherein the first microsector is coupled to a first row controller, the first microsector comprising:
a plurality of logic access blocks, each logic access block coupled to a respective one of a plurality of data registers;
a plurality of routing blocks, each routing block comprising a first highly pipelined (HIPI) register chain and a second HIPI register chain, wherein at least one of the plurality of data registers is coupled to at least one of the first HIPI register chain and second HIPI register chain; and
a control block comprising a first shift register chain configurable to shift data out of the first microsector to the first row controller and a second shift register chain configurable to shift data into the first microsector from the first row controller.

2. The integrated circuit of claim 1, wherein the first shift register chain comprises a plurality of shift registers.

3. The integrated circuit of claim 2, wherein a portion of the plurality of shift registers are inactive shift registers.

4. The integrated circuit of claim 1, wherein the first row controller comprises a first control circuit configurable to receive data from the first shift register chain.

5. The integrated circuit of claim 4, wherein the first row controller comprises a second control circuit configurable to shift data to the second shift register chain.

6. The integrated circuit of claim 5, wherein the second control circuit is configurable to convert data into a number of data frames.

7. The integrated circuit of claim 4, wherein the first control circuit is configurable to convert data received from the first shift register chain from a number of data frames to a data format associated with the first row controller.

8. The integrated circuit of claim 1, wherein a number of bits shifted out from the first shift register chain is based on a frequency of at least one of the plurality of data registers and a frequency of the first shift register chain.

9. A system, comprising:
programmable logic circuitry comprising configuration memory, the programmable logic circuitry comprising:
a first microsector, wherein the first microsector is coupled to a first row controller, the first microsector comprising:
a plurality of logic access blocks, each logic access block coupled to a respective one of a plurality of data registers;
a plurality of routing blocks, each routing block comprising a first highly pipelined (HIPI) register chain and a second HIPI register chain, wherein at least one of the plurality of data registers is coupled to at least one of the first HIPI register chain and the second HIPI register chain; and
a control block comprising a first shift register chain configurable to shift data out of the first microsector to the first row controller; and
a first control circuitry of the first row controller, wherein the first control circuitry is configured to receive data from the first shift register chain.

10. The system of claim 9, the control block comprising second shift register chain configurable to shift data into the first microsector from the first row controller.

11. The system of claim 10, comprising a second control circuitry, wherein the second control circuitry is configured to shift data into the second shift register chain.

12. The system of claim 11, wherein the first control circuitry and the second control circuitry are disposed in the first row controller.

13. The system of claim 11, wherein the second control circuitry is configured to convert data into a number of data frames.

* * * * *